United States Patent [19]
Miyamoto et al.

[11] Patent Number: 5,178,962
[45] Date of Patent: Jan. 12, 1993

[54] METAL-ORGANIC MACROMOLECULAR SYNTHETIC RESIN COMPOSITE AND PROCESS FOR PRODUCING THE SAME

[75] Inventors: Toshio Miyamoto, Takasaki; Kunio Miyazaki, Hitachi; Ryuji Watanabe, Ibaraki; Osamu Miura, Hitachi; Yukio Ookoshi, Mito; Yuichi Satsu; Michio Ohue, both of Hitachi; Shigeru Takahashi, Hitachiota; Yoshiyuki Tsuru, Shimodate, all of Japan

[73] Assignees: Hitachi, Ltd.; Hitachi Chemical Company Ltd., both of Tokyo, Japan

[21] Appl. No.: 495,268

[22] Filed: Mar. 19, 1990

[30] Foreign Application Priority Data

Mar. 20, 1989 [JP] Japan .................... 1-066206

[51] Int. Cl.⁵ .............................. B32B 15/08
[52] U.S. Cl. .................... 428/463; 427/564; 427/576; 428/457
[58] Field of Search ............ 428/458, 461, 421, 463; 427/40, 38; 156/272.6

[56] References Cited

U.S. PATENT DOCUMENTS

| | | | |
|---|---|---|---|
| 4,165,394 | 8/1979 | Ehrbar et al. | 427/40 |
| 4,188,426 | 2/1980 | Auerbach | 427/40 |
| 4,250,225 | 2/1981 | Shirahata et al. | 428/458 X |
| 4,337,279 | 6/1982 | Polak | 428/461 X |
| 4,382,101 | 5/1983 | Polak | 427/40 |
| 4,393,092 | 7/1983 | Gill | 427/38 |
| 4,452,827 | 1/1984 | Kolev et al. | 427/38 |
| 4,765,860 | 8/1988 | Ueno et al. | 156/272.6 |

FOREIGN PATENT DOCUMENTS 8901957 3/1989 PCT Int'l Appl. ............ 427/40

OTHER PUBLICATIONS

English Translation of Japanese Laid Open Patent Application No. 62-177189, Kokai, Aug. 4, 1987.

Primary Examiner—Thomas J. Herbert, Jr.
Attorney, Agent, or Firm—Antonelli, Terry, Stout & Kraus

[57] ABSTRACT

A composite of metal and an organic film having a high adhesiveness without deterioration of film quality is provided by exposing the surface of organic film to at least one of chemically reactive gas phase molecules and gas phase ions thereby forming functional groups on the surface of organic film, and forming a metallic film thereon through the functional groups.

13 Claims, 21 Drawing Sheets

METAL-ORGANIC MACROMOLECULAR SYNTHETIC RESIN COMPOSITE AND PROCESS FOR PRODUCING THE SAME

BACKGROUND OF THE INVENTION (1) Field of the Invention

This invention relates to a metal-organic macromolecular synthetic resin composite and a process for producing the same, and more particularly to a metal-organic macromolecular synthetic resin composite having an improved adhesiveness between an organic macromolecular synthetic resin film, which will be hereinafter referred to as "organic film", and a metallic film, and a process for producing the same.

(2) Prior Art

With recent progress in electronic devices of smaller scale and higher speed, their mounted systems are calling for a higher density. For example, circuit substrates for mounting LSI are changing from conventional ceramic substrates provided with wirings of a metal such as tungsten, etc. on their surfaces by a printing technique to ceramic substrates provided with a thin-film, multilayer circuit composed of organic films of, for example, polyimide, as insulating films and metallic films of, for example, copper as conductor wirings by photolithography. That is, composites of organic films and metallic films have been regarded as important.

As to adhesion of polyimide for use as insulating films to copper for use as conductor wirings, direct vapor deposition of copper onto polyimide without any adhesive has been investigated to meet formation of finer circuit patterns and higher heat resistance. For example, Japanese Patent Application Kokai (Laid-open) No. 61-295365 discloses changing of chemical structure of polyimide in the region at a depth of about 10 to about 300 Å from the surface by irradiating the polyimide surface with lower energy particles composed of reactive ions or electrons having an energy of about 50 to about 2,000 eV or photons having an energy of about 0.2 to about 500 eV, and successive vapor deposition of a metal thereon, thereby improving the adhesiveness between the polyimide and the metal.

Japanese Patent Application Kokai (Laid-open) No. 53-71182 discloses a means for corona discharge treatment of a polypropylene film surface in the atmosphere, followed by vapor deposition of aluminum thereon. Japanese Patent Application Kokai (Laid-open) No. 51-49704 discloses a means for glow discharge treatment of a plastic substrate surface, followed by electroless magnetic plating. Japanese Patent Publication No. 61-34513 discloses a means for RF plasma treatment of an organic resin film, followed by forming of a metallic film thereon by vapor deposition or plating, thereby improving an adhesiveness between the organic resin film and the metallic film. Furthermore, Japanese Patent Application Kokai (Laid-open) No. 61-95596 discloses insertion of a metal having a good adhesiveness, such as titanium, etc. between polyimide and copper, thereby improving the adhesiveness between the polyimide and the copper. Furthermore, as to polyimide, it is a recent tendency to use polyimide of low thermal expansion whose coefficient of thermal expansion approximates to those of copper and silicon in place of the so far used ordinary polyimide.

Some effects on the adhesiveness between the metallic film and the organic film are found when the organic film is placed on an electrode surface and subjected to a surface treatment by the corona discharge technique disclosed in the above-mentioned Japanese Patent Application Kokai (Laid-open) No. 53-71182 or by the glow discharge technique disclosed in the above-mentioned Japanese Patent Application Kokai (Laid-open) No. 51-49704. However, these treatments bring about a considerable inside deterioration of organic film, particularly considerable deterioration by dielectric strength, due to the strong action of electrons having a high kinetic energy. When the organic film is placed in a cyclindrical form at the position near the electrode to evade the action of electrons, no substantial adhesiveness is found between the metallic film and the organic film.

The technique disclosed in the above-mentioned Japanese Patent Application Kokai (Laid-open) No. 61-95596 is effective for the adhesiveness between the ordinary polyimide and copper to some extent, but has no substantial effect on the adhesiveness on the polyimide of low thermal expansion and copper. No disclosure is made at all therein as to other organic films than polyimide.

The present inventors made comparison of peel strength of polyimide films when PIQ (trademark of a product made by Hitachi Kasei Kogyo K.K., Japan) was used as the ordinary polyimide and PIQ-L100 (trademark of a product made by Hitachi Kasei Kogyo K.K., Japan) was used as polyimide of low thermal expansion in the technique of Japanese Patent Application Kokai (Laid-open) No. 61-95596. It was found that the peel strength was increased from 100 g/cm to 700 g/cm in the case of the ordinary polyimide, whereas it was increased only from 10 g/cm to 35 g/cm in the case of polyimide of low thermal expansion, because in the case of titanium insertion the polyimide of low thermal expansion has less functional groups capable of bonding to titanium, such as carbonyl groups, etc. Thus, in the case of polyimide of low thermal expansion, the adhesiveness was not improved and no substantial effect was obtained.

Likewise, the present inventors made comparison of peel strength in the technique of the above-mentioned Japanese Patent Application Kokai (Laid-open) No. 61-295365 between the case of ordinary polyimide and the case of polyimide of low thermal expansion. It was found that the peel strength was increased only from 100 g/cm to 300 g/cm in the former case and only from 10 g/cm to 25 g/cm in the latter case, and thus no substantial effect was obtained. One of causes seems to be that, though it is only the surface region that directly contributes to an improvement in the adhesiveness, a change is brought about to the chemical structure in a deeper region than the surface region by irradiation with particles having an energy of about 50 to 2,000 eV, resulting in deterioration of mechanical strength of polyimide itself, which leads to aggregation breakage of the entire polyimide. Furthermore, no mention is made of organic films other than the polyimide film in the above-mentioned Japanese Patent Application Kokai (Laid-open) No. 61-295365.

In the case of RF plasma treatment disclosed in the above-mentioned Japanese Patent Publication No. 61-34513, the organic film is considerably deteriorated at the inside, because of the exposure of the organic film to particles of high kinetic energy, and deterioration of mechanical strength of the organic film itself is brought about thereby.

Low energy plasma treatments are also disclosed in U.S. Pat. No. 4,393,092 and Japanese Patent Applications Kokai (Laid-open) Nos. 57-138, 60-21593 and 61-139918, and low temperature plasma treatments are also disclosed in U.S. Pat. No. 4,188,426 and Japanese Patent Application Kokai (Laid-open) Nos. 59-218789, 61-182942 and 57-186385, but no electron cyclotron resonance plasma is used in these treatments of the prior art.

RF plasma treatment is also disclosed in Japanese Patent Application Kokai (Laid-open) No. 62-116763; ionization plating in Japanese Patent Application Kokai (Laid-open) Nos. 61-183460 and 50-77863, and corona discharge treatment in Japanese Patent Application Kokai (Laid-open) No. 53-101069, but the organic films are considerably deteriorated at the inside in these treatments, resulting in deterioration of mechanical strength of the organic films themselves.

On the other hand, modification by electron cyclotron resonance plasma is disclosed in Japanese Patent Application Kokai (Laid-open) No. 62-177189, but no mention is made of the adhesiveness problem and also uses are different from that of the present invention.

SUMMARY OF THE INVENTION

An object of the present invention is to provide a composite of organic macromolecular synthetic resin having a stronger adhesiveness that those obtained by corona discharge surface treatment, glow discharge surface treatment, or RF plasma surface treatment, and a metal.

Another object of the present invention is to provide a composite of an organic film having a strong adhesiveness and another organic film.

Other object of the present invention is to provide a process for producing a composite of an organic macromolecular synthetic resin having a strong adhesiveness and a metal.

The present composition of an organic macromolecular synthetic resin and a metal is characterized by comprising an organic film having functional groups formed by exposing the substantial surface of organic film to at least one of chemically reactive gas phase molecules and gas phase ions having a kinetic energy of 1 to 20 eV on the substantial surface, and a metallic film formed on the organic film having the functional groups.

It is preferable that the organic film and the metallic film are in a coordination bondage.

The present composite has a peel strength of 200 g/cm or more, preferably 300 g/cm or more. Furthermore, the present composite has no substantial aggregation breakage. The term "substantial" herein used means a film thickness of not more than about 100 Å and the term "aggregation breakage" means a decrease in the mechanical strength within an organic film.

It is preferable that the functional groups are those which can form stable complexes with a metal at the ordinary temperature. It is also desirable that the functional groups are at least one kind of functional groups selected from the group consisting of amino, imido, imino, cyano, amido, oxime, carboxyl, carbonyl, hydroxyl, C—F group, C=S group, mercapto, brominated carbon group and iodized carbon group.

The relative concentration of the functional groups per one carbon atom is as follows:

(1) in the case of nitrogen-containing functional groups 0.05 to 0.25, preferably 0.08 to 0.22 as total of amino, imino, amido, imido and cyano groups, and 0.07 to 0.24, preferably 0.10 to 0.21 as oxime groups;

(2) in the case of oxygen-containing functional groups, 0.09 to 0.39, preferably 0.12 to 0.36 as total of carbonyl and carboxyl groups and 0.17 to 0.48, preferably 0.20 to 0.48 as hydroxyl groups;

(3) in the case of sulfur-containing functional groups, 0.10 to 0.17 as S—H groups and 0.03 to 0.07 as C=S groups;

(4) in the case of fluorine-containing functional groups, 0.30 to 0.42;

(5) in the case of bromine-containing functional groups, 0.28 to 0.37; and (6) in the case of iodine-containing functional groups, 0.15 to 0.32.

Furthermore, it is desirable that the functional groups contain elements having a higher electronegativity than carbon or a higher dielectric polarization or both and also having lone pairs. More specifically, elements having an electronegativity of 2.5 to 4.0 are preferable. The term "electronegativity" herein used is the one defined by L. Pauling. Furthermore, it is preferable that the functional groups contain at least one element selected from the group consisting of nitrogen, oxygen, fluorine, sulfur, bromine and iodine.

It is desirable that the chemically reactive gas phase molecules or gas phase ions are chemically reactive species formed from $NH_3$, $NO_2$, $CH_3CN$, $NH_2OH$, $HCN$, $N_2$, $O_2$, $CO_2$, $H_2O$, $CF_4$, $CHF_3$, $CS_2$, $SO_2$, $H_2S$, $CH_2Br_2$, $CH_3Br$, $Br_2$, $CH_2F_2$, $CH_3I$, and molecules containing at least one of hydrogen, nitrogen, oxygen, fluorine, sulfur, bromine and iodine atoms, and it is preferable that the chemically reactive gas phase molecules or gas phase ions are formed from a gaseous mixture thereof.

The term "chemically reactive" herein used means radicals (with unpaired electrons) or ions.

It is desirable to form these chemically reactive species by heat excitation, photoexcitation or plasma generation. Chemically reactive species having a low energy, particularly a kinetic energy of not more than 20 eV can be formed also by apparatuses for generating microwaves, semiconductor laser, excimer laser, RF plasma, corona discharge, glow discharge, ECR microwave plasma, etc. However, when numbers of conditions are taken into consideration, it is most preferable to use an apparatus for generating an electron cyclotron resonance plasma, because of remarkable improvement in the adhesiveness of organic macromolecular synthetic resin film.

An apparatus for generating the electron cyclotron resonance plasma, which will be hereinafter referred to as "ECR plasma", that is, an ECR plasma generator, has at least three coils along the side wall of a cylindrical chamber, where a magnetic field is controlled by the coils. A microwave is led into the cylindrical chamber in the vertical direction to form an ECR point near the substrate surface. Generally, the ECR point can be changed as a distance from the substrate surface by changing the quantity of current to the coils. At the ECR point, a plasma with a low kinetic energy, a high ionization efficiency and a high density of electronically excited species can be formed, and thus a plasma treatment can be carried out with a remarkable improvement in the adhesiveness.

The ECR plasma has a very high ionization efficiency, as compared with other plasmas, and thus also has a very high photoemission intensity. Furthermore, the ECR plasma generator generates plasma having a low kinetic energy of not more than 50 eV, preferably not more than 20 eV. A high ionization efficiency specifically means that a density of electronically excited species is 1% or more near the substrate surface under any given conditions. The term "excited state" refers to a higher energy level than the ground state among the ground states in the system of quantum mechanics.

It is desirable that the metal for use in a metallic film is at least one element selected from the group consisting of Cu, Ag, Au, Ni, Pd, Pt, Zr, Nb, Si, W, Mo, Cr and Al, and particularly preferable are Cu and Al. Alloys containing at least one of these metal elements as the main component may be used.

For formation of the metallic film, a vapor deposition apparatus, an ion plating apparatus, or a sputtering apparatus for a CVD apparatus can be used.

The organic film for use in the present invention is preferably those capable of forming an insulating film for electronic devices, such as a polyimide film, a polyamide film, a polyamideimide film, a polyester film, an epoxy resin film, a phenol resin film, a teflon film, etc., and particularly desirable is a polyimide film, especially a polyimide film of low thermal expansion. The polyimide film is disclosed in Japanese Patent Applications Kokai (laid-open) Nos. 60-32827, 60-243120, 60-157286, 60-250031 and 60-208358, but is not limited thereto.

It is preferable to use an organic film having a coefficient of thermal expansion of $0.1 \times 10^{-5}$ to $5.0 \times 10^{-5}(/°C.)$. Furthermore, it is preferable that the organic film has such a heat resistance as a weight loss of not more than 5% at about 500° C., preferably not more than 5% at about 200° C.

Exposure of the surface of an organic film to at least one of gas phase molecules and gas phase ions does not mean bombardment of the molecules or ions into the organic film, but means that the organic film on which a metallic film is to be formed is left standing in such a gas phase state. Furthermore, the molecules or ions must not be accelerated by applying a bias voltage, etc. to the apparatus. Thus, the surface of the organic film is modified to a depth of not more than 100 Å, preferably not more than 10 Å. The depth of not more than 100 Å is a depth from the surface having fine irregularities (convex and concave parts) of about 1 μm, since the organic film has properly such irregularities on the surface, and means that only the surface region can be modified by the plasma treatment of low kinetic energy.

In order to improve the adhesiveness between the organic film and the metallic film, it is desirable to insert an adhesive metallic layer having an ionic bond to the organic macromolecular synthetic resin between the organic film and the metallic film. More specifically, it is preferable to use at least one element selected from the group consisting of Ti, Zr, V, Nb, Hf, Ta, Al, Cr, Mo and W for the adhesive metallic layer. Furthermore, in order to improve the adhesiveness between the organic film and the metallic film, the metallic film may be formed after the plasma treatment of the organic film and successive application of an adhesive composed of ordinary organic materials thereto.

The organic film exposed to the gas phase state has somewhat more irregularities than the unexposed organic film, and the shape of the irregularities also contributes to an improvement in the adhesiveness of the organic film to the metallic film.

It is more preferable to roughen the surface of the organic film in advance to increase the contact area and then to expose the roughened surface of the organic film to the gas phase molecules or gas phase ions to further improve the adhesiveness. More specifically, it is preferable to treat the surface of an organic film with plasma of Ar, etc.

After the exposure of the organic film to the gas phase molecules or gas phase ions, metals are bombarded onto the organic film to form a mixed region between the organic film and the metallic region, whereby the adhesiveness is more improved.

The present process for producing a composite of organic macromolecular synthetic resin and metal is characterized by comprising a step of exposing the surface of an organic film to at least one of chemically reactive gas phase molecules and gas phase ions having a kinetic energy of 1 to 20 eV, preferably 3 to 18 eV, more preferably 5 to 13 eV, and a step of forming a metallic film on the organic film exposed to at least one of the gas phase molecules and gas phase ions.

The kinetic energy acts on the surface of an organic film at least in the direction perpendicular to the organic film, and a higher kinetic energy may act in the parallel direction to the organic film.

It is also preferable to generate the gas phase molecules or gas phase ions from a mixed gas having substantially the same element composition as that of the functional groups interacting on the metallic film.

The term "kinetic energy of 1 to 20 eV" means that at least 70%, preferably at least 80% of the gas phase molecules or gas phase ions have such kinetic energy.

Why the lower limit of the kinetic energy is 1 eV is that the cleaning effect of the organic film surface is so low below 1 eV that the effect on the modification is small.

The step of exposing to chemically reactive gas phase molecules or gas phase ions is a step of introducing excited or ionized atoms, molecules or radicals (having unpaired electrons). The metallic film is formed on the organic film as a thin film by evaporating the metallic element.

Furthermore, the present invention is utilized as circuit films for electronic parts, particularly as circuit films using organic films for insulation between the individual circuits. Thus, the present invention is applicable to flexible circuit boards, tape-automated bonding (which will be hereinafter referred to as "TAB"), various semiconductor package substrates, etc.

Since the present composite of organic macromolecular synthetic resin and a metal has a strong adhesiveness, the circuit films based on the present composite have a higher reliability. By applying the present invention to these electronic parts, electronic devices with an improved reliability can be provided.

The circuit film according to the present invention is characterized by comprising an organic film having functional groups formed on the substantial surface by exposing the substantial surface to at least one of chemically reactive gas phase molecules and gas phase ions having a kinetic energy of 1 to 20 eV and a metallic film selectively formed on the organic film having the functional groups, the circuit film having a peel strength of at least 200 g/cm, preferably at least 300 g/cm.

A flexible circuit substrate using an organic film, particularly a polyimide film, is characterized by comprising functional groups formed by exposing the substantial surface of a flexible polyimide film to at least one of chemically reactive gas phase molecules and gas phase ions having a kinetic energy of 1 to 20 eV, and a conductor circuit selectively formed on the polyimide film having the functional groups.

Furthermore, TAB using an organic film, particularly a polyimide film, is characterized by comprising functional groups formed by exposing the substantial surface of a tape-formed polyimide film to at least one of chemically reactive gas phase molecules and gas phase ions having a kinetic energy of 1 to 20 eV and a conductor circuit selectively formed on the polyimide film having the functional groups.

Furthermore, a package substrate comprises an electrically insulating substrate, a multi-layered circuit film composed of metallic films and organic films and formed on the substrate, and pins for transmitting signals to the outside, characterized by having functional groups formed on the boundary surfaces of the organic films to the metallic films by exposing the surfaces of the organic films to at least one of chemically reactive gas phase molecules and gas phase ions having a kinetic energy of 1 to 20 eV.

Still furthermore, a multi-layered printed board comprises a lamination of organic films as an insulating materials and metallic films selectively formed on the organic films, characterized by having functional groups formed on the boundary surfaces of the organic films to the metallic films by exposing the surfaces of the organic films to at least one of chemically reactive gas phase molecules and gas phase ions having a kinetic energy of 1 to 20 eV.

The present composite can be also applied to modulated semiconductor-mounted apparatuses and computers.

A semiconductor-mounted apparatus comprises an electrically insulating substrate, a multi-layered circuit film using metallic films and organic films, formed on the substrate, at least two semiconductor devices formed on the circuit film, and a means for transmitting signal to the outside through the semiconductor devices and conductor circuits in the circuit film, characterized by having functional groups formed on the boundary surfaces of the organic films to the metallic films by exposing the surfaces of the organic films to at least one of chemically reactive gas phase molecules and gas phase ions having a kinetic energy of 1 to 20 eV.

A computer according to the present invention comprises a platter, a multi-layered, printed substrate mounted on the platter through a connector and a semiconductor logical package and a main semiconductor memory package mounted on the substrate, a semiconductor device being mounted on at least one of the semiconductor packages, the multi-layered, printed substrate having organic films as insulating layers and metallic films as conductor circuit layers selectively formed on the organic films, and having functional groups formed on the boundary surfaces of the organic films to the metallic films by exposing the substantial surfaces of the organic films to at least one of chemically reactive gas phase molecules and gas phase ions having a kinetic energy of 1 to 20 eV.

The function of the present invention will be explained below.

The surface of an organic film is treated with chemical species having a low energy of not more than 20 eV, generated by microwave, semiconductor laser, excimer laser, plasma, etc. More specifically, the surface of an organic film is treated by exposure to plasma, etc. For example (1) In the case that the chemical species are $N_2$, $NH_3$, $NO_2$, $CH_3CN$, $NH_2OH$ and $HCN$, at least one of amino, imido, imino, amido, cyano and oxime groups is contained in the surface region of an organic film, and thus nitrogen is contained at a high density and functional groups including at least one of these groups are contained at a high density.

(2) In the case that the chemical species are $O_2$, $CO_2$, $CO$ and $H_2O$, at least one of carboxyl, carbonyl and hydroxyl groups is contained in the surface region of an organic film, and thus oxygen is contained at a high density and functional groups including at least one of these groups are contained at a high concentration.

(3) In the case that the chemical species are $CS_2$, $SO_2$ and $H_2S$, at least one of C=S group and mercapto group is contained in the surface region of an organic film, and thus sulfur is contained at a high concentration and functional groups including at least one of these groups are contained at a high concentration.

(4) In the case that the chemical species are $F_2$, $CF_4$ and $CHF_3$, fluorinated carbon is contained in the surface region of an organic film at a high density and functional groups including at least one of these groups are contained at a high density.

(5) In the case that the chemical species are $CH_2Br_2$, $CH_3Br$ and $B_2$, brominated carbon is contained in the surface region of an organic film at a high density and thus functional groups including at least one of these groups are contained at a high density.

(6) In the case that the chemical species are $CH_2I_2$, $CH_3I$ and $I_2$, iodized carbon is contained in the surface region of an organic film at a high density and thus functional groups including at least one of these groups are contained at a high density.

The surface region containing these atoms of nitrogen, etc. at a high density is a modified layer. A metallic film is formed on the modified layer. Metal elements that form the mertallic film are deposited in a partially ionized state on the modified layer. At that time, the lone pairs of atoms of nitrogen, etc. in the modified layer interact with the metal ions to form coordination bonds between the metal and the atoms. Thus, a strong chemical bond is formed between the metallic film and the modified layer, and the resulting composite has a strong adhesiveness and thus has improved moisture resistance and durability.

PREFERRED EMBODIMENTS OF THE INVENTION

Example 1

One embodiment of the present invention will be explained below, referring to FIG. 1, which is a partially enlarged view of a composite of organic macromolecular synthetic resin and a metal, where numeral 1 is a polyimide film of low thermal expansion used as an organic film, numeral 3 is a metallic film as a conductor circuit (in this example copper is used for the metallic film), and numeral 2 is a modified region of the polyimide film of low thermal expansion for improving the adhesiveness. The modified region contains at least one of nitrogen-containing groups, i.e. amino, imido, imino, amido and cyano groups.

The polyimide film may be formed on a substrate of ceramics, glass, etc., or may be used alone.

A process for producing a composite of organic macromolecular synthetic resin and a metal shown in FIG. 1 will be explained below.

At first, a silicon substrate was subjected to an aluminum chelate treatment to improve the adhesiveness to polyimide of low thermal expansion, and then polyimide of low thermal expansion was spin coated thereon to a film thickness of 0.7 μm and then cured in a nitrogen gas atmosphere to prevent oxidation of a metallic film to be formed successively. As the polyimide of low thermal expansion as an organic macromolecular synthetic resin, PIQ-L100 (trademark of a product made by Hitachi Kasei Kogyo K.K., Japan) was used.

Then, the cured polyimide was subjected to a surface treatment by a microwave heating apparatus.

The surface treatment was carried out in the following manner. At first, the substrate with the polyimide film of low thermal expansion was placed as a sample in a sample chamber and an $NH_3$ gas was passed over the sample surface at a flow rate of 200 cc/min. to form an atmosphere at 4 m torr. Then, the sample was irradiated in the direction perpendicular to the sample with microwaves of 200 to 1,500 W introduced from a microwave guide tube for 10 minutes to generate rotating excited species of $NH_3$. At that time, the frequency of microwave was 2.45 GHz. To prevent the polyimide from decomposition due to a temperature increase, the substrate was water cooled at the back side. In this manner, the treatment was conducted for 10 minutes.

Then, the substrate was transferred into another vacuum chamber, where copper was vapor deposited onto the surface of the polyimide film to a film thickness of 5 μm by electron beam heating at a substrate temperature of 200° C. and a vapor deposition rate of 10–100 Å/sec. Then, the sample was cut into strips, 1 cm wide, which were subjected to 90° peel tests at a peeling speed of 0.5 mm/min.

Figure 2:
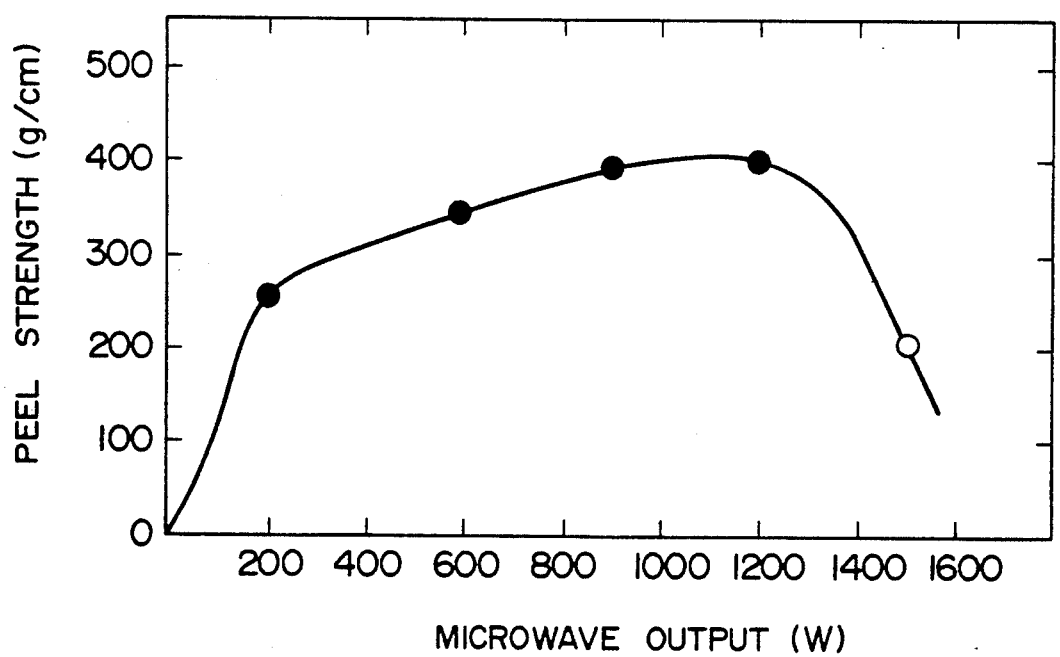
FIG. 2 is a diagram showing a relationship between the microwave output and the peel strength in a microwave heating treatment.

The results are shown in FIG. 2, which shows a relationship between the microwave output (W) and the peel strength (g/cm), where mark "O" shows occurrence of peeling due to aggregation breakage.

When a copper film deposited on a polyimide film (PIQ-L100) of low thermal expansion without the surface treatment was subjected to the same peel test as above, it was found that the peel strength was less than 5 g/cm. That is, there was a 80-fold difference in the peel strength at a microwave output of 1,200 W between the case with the surface treatment (400 g/cm) and the case without the surface treatment (5 g/cm), and thus the adhesiveness was considerably improved by application of the surface treatment.

In the case of vapor deposition at a substrate temperature of 350° C., the peel strength was 270 g/cm, and thus in the range of 200° to 350° C. a lower substrate temperature is preferable for the vapor deposition of a metallic film.

Then, the surfaces of polyimide films of low thermal expansion subjected to the microwave heating treatment of ammonia ($NH_3$) (microwave output: 1,200 W) were subjected to XPS analysis in an XPS analysis apparatus μ-ESCA (SSX-100-206, trademark of SSI, USA), using Al-Kα ray (1486.6 eV) as X-rays. It was found that ratios of oxygen atoms and nitrogen atoms to carbon atmos (O/C and N/C) in the surface layer was 0.18 and 0.25, respectively. Since O/C and N/C in the molecular structure of polyimide of low thermal expansion (PIQL100) were 0.18 and 0.09, respectively, it was found that the nitrogen concentration in the surface region was considerably increased, i.e. 2.8-fold.

Figure 3:
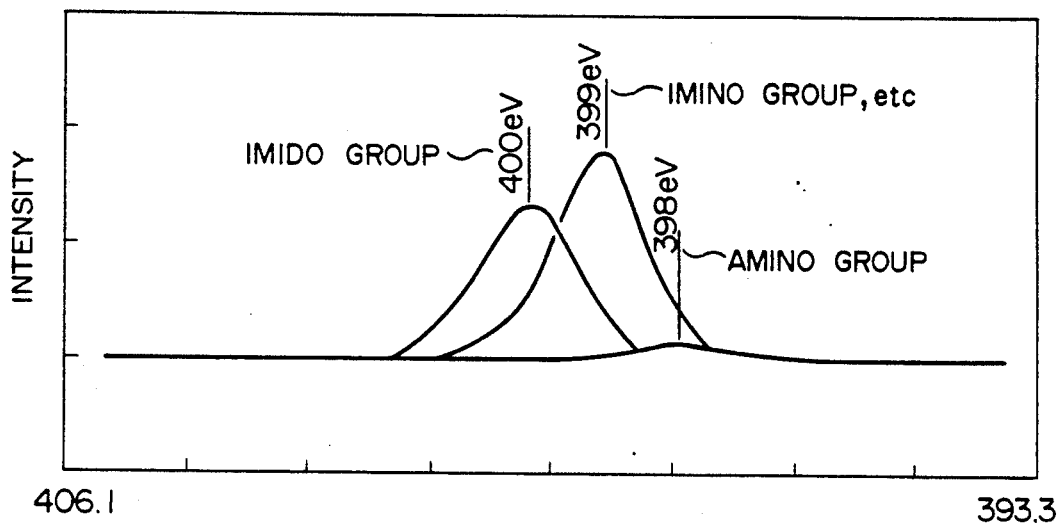
FIGS. 3, 4, 8 and 25 are diagrams showing N $1_s$ spectrum at XPS analysis of modified surfaces of polyimide films of low thermal expansion according to the present invention.

In FIG. 3, spectrum of bonding energy (B.E.) N $1_s$ of polyimide surface at a microwave output of 1,200 W is shown. Besides the imido group (B.E.=400 eV), an imino group, a cyano group and an amido group (B.E.=399 eV) and an amino group (B.E.=398 eV) were detected, and their proportion was 7:40:53 in the order of higher to lower B.E. From this result it was found that the surface region of polyimide film of low thermal expansion, modified by the microwave heating treatment, contained at least one of such functional groups as imino group, amido group, cyano group and amino group besides the imido group. It can be seen from the foregoing results that the nitrogen-containing functional groups are effective for improving the adhesiveness.

No insertion of the conventional adhesive layer is required in the present structure as explained above, and thus the production steps can be reduced.

Example 2

A polyimide film of low thermal expansion was formed in the same manner as in Example 1 and subjected to a surface treatment by a gas laser apparatus. The surface treatment was carried out in the following manner: The substrate with the polyimide film of low thermal expansion was placed as a sample in a sample chamber and an $NH_3$ gas was passed over the sample surface at a flow rate of 100 cc/min. to form an atmosphere at 1 m Torr. Then, an ArF excimer laser of 10 W was led to the position near and in parallel to the electrode on the sample surface to generate electronically excited species of $NH_3$.

After the treatment for 10 minutes, copper was vapor deposited onto the polyimide film in the same manner as in Example 1 and then the sample was subjected to the same peel test under the same conditions as in Example 1. It was found that the peel strength was 440 g/cm.

Example 3

A polyimide film of low thermal expansion was formed in the same manner as in Example 1 and then subjected to a surface treatment by an ECR microwave plasma CVD apparatus.

Figure 39:
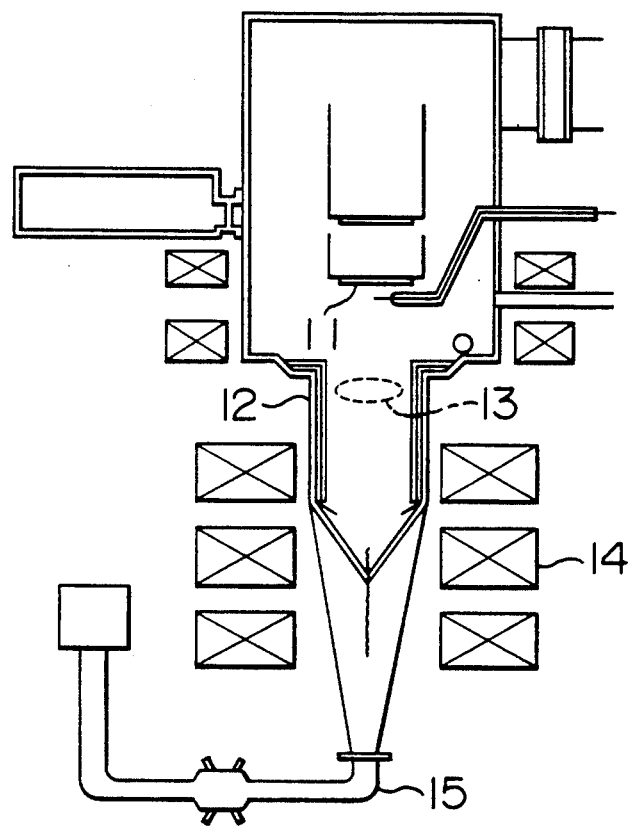
FIG. 39 is a view schematically showing an ECR plasma generator.

The outline of the ECR microwave plasma CVD apparatus is shown in FIG. 39. Magnetic field-controlling coils 14 were provided along the side wall of a cylindrical chamber 12. By controlling the current passing through the coils 14, the position of an ECR point 13 generated in the chamber 12 was controlled. On the other hand, a microwave was led to the chamber 12 from a microwave guide tube 15 to generate a plasma. A polyimide film of low thermal expansion was placed in a substrate 11 and subjected to a surface treatment.

The surface treatment was carried out in the following manner: after the polyimide film was placed on the substrate in the sample chamber as a sample, a nitrogen gas was introduced into the plasma generation chamber to form an atmosphere at 0.8 m Torr. By irradiating the atmosphere with a microwave of 50 to 1,000 W introduced from the microwave guide tube, a plasma was generated. A microwave output ranging from 50 to 1,000 W was statisfactory. By changing the distance between the electron cyclotron resonance zone and the substrate, an influence of the plasma upon the substrate could be changed. In this test, the distance was changed in a range of 0 to 30 cm.

After the treatment in this manner for 3 minutes, copper was vapor deposited on the polyimide film in the same manner as in Example 1. It was found by XPS analysis that ratios of oxygen atoms and nitrogen atoms to carbon atoms (O/C and N/C) in the surface region (treatment with microwaves of 300 W) were 0.21 and 0.24, respectively. It was obvious therefrom that the nitrogen concentration in the surface region of polyimide of low thermal expansion (PIQ-L100) was considerably increased (2.7-fold) by the treatment with microwaves of 300 W.

Figure 4:
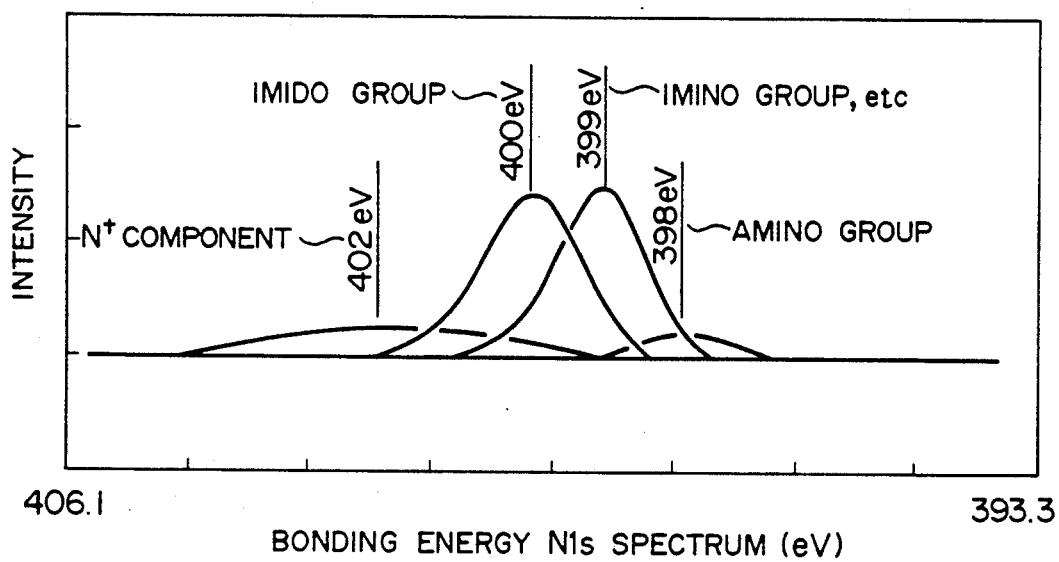
Figure 5:
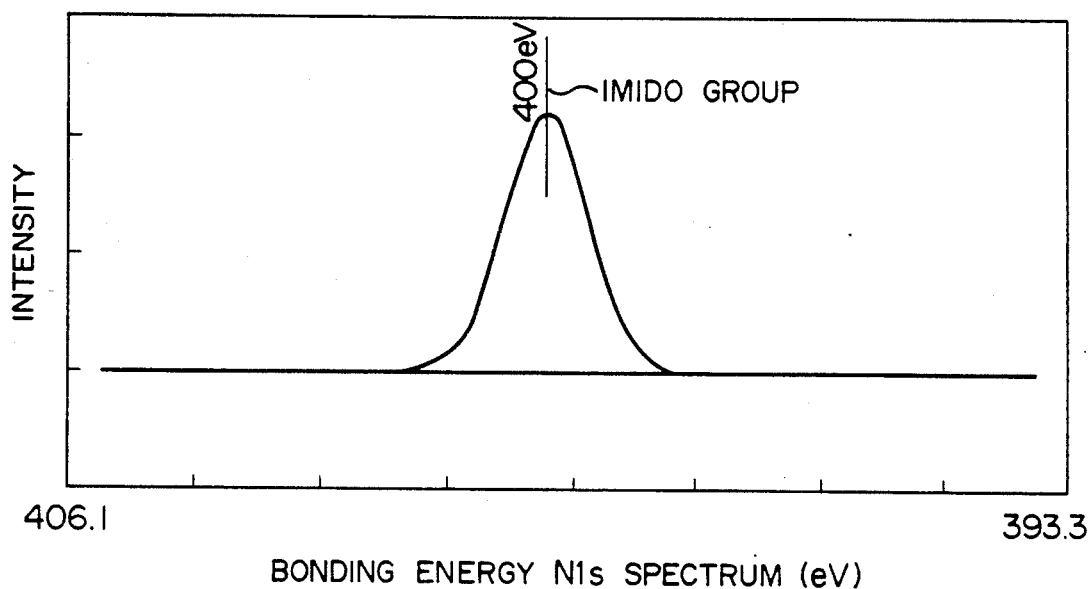
FIG. 5 is a diagram showing N $1_s$ spectrum at XPS analysis of the surface of polyimide film of low thermal expansion.

In FIG. 4, N $1_s$ spectrum of the surface is shown, and in FIG. 5 N $1_s$ spectrum of the surface without the surface treatment is shown. As shown in FIG. 5, there was only the imido group in the case of non-treatment, whereas in the case of the ECR microwave plasma treatment an imino group, a cyano group and an amido group (B.E.=399 eV), an amino group (B.E.=398 eV) and a $N^+$ component (B.E.=402 eV) were detected besides the imido group (B.E.=400 eV) and their proportion was 8:44:43:6 in the order of higher to lower B.E. From this result it was found that the surface region of polyimide film of low thermal expansion, modified by the nitrogen plasma treatment, contained at least one of such functional groups as amino group, imino group, amido group and cyano group besides the imido group.

In the plasma treatment, a negative bias could be applied to the substrate by applying a radio frequency of 13.56 MHz to the substrate by a radio frequency oscillator. As a result, a kinetic energy corresponding to the bias value could be given to the positive ions in the plasma.

Figure 6:
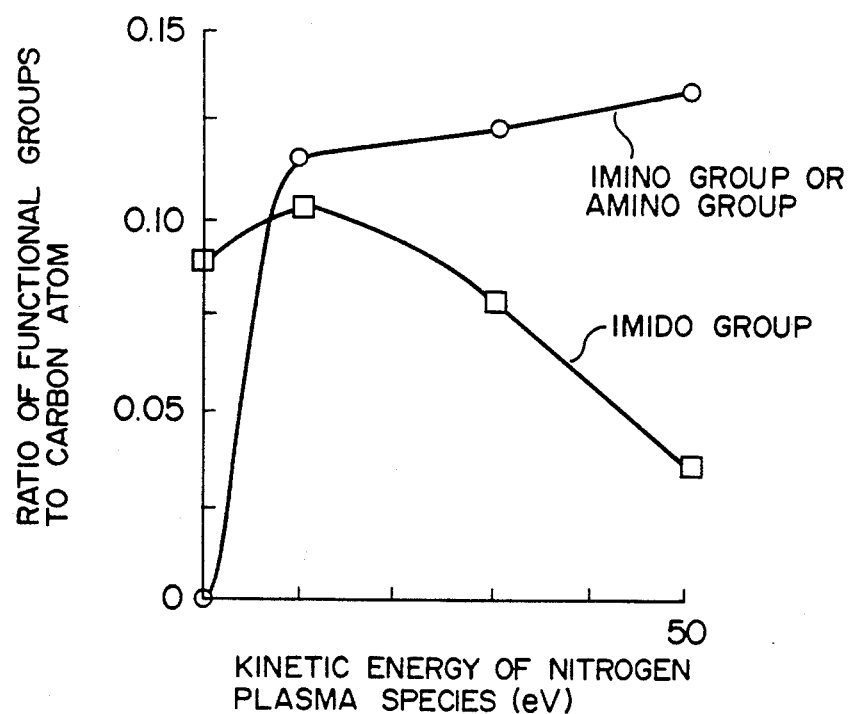
FIGS. 6, 11, 13, 16, 18 and 20 are diagrams showing relationships between the kinetic energy of various plasma species and ratios of various functional groups to carbon atom in ECR plasma treatments of nitrogen, oxygen, fluorine, sulfur, bromine and iodine, respectively.

FIG. 6 shows relationships between the kinetic energy of nitrogen plasma species at a radio frequency output of 0 to 300 W and ratios of functional groups to carbon atoms, where a kinetic energy was ranged from 0 to 50 eV.

Figure 7:
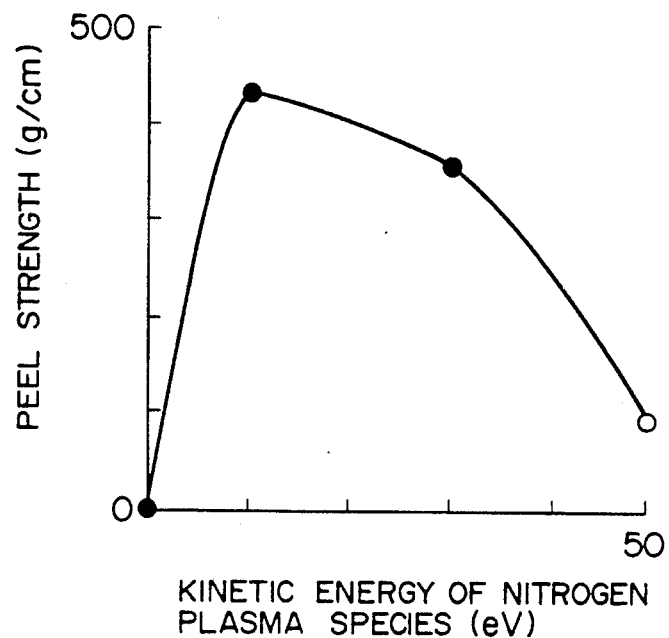
FIGS. 7, 12, 14, 17, 19 and 21 are diagrams showing relationships between the kinetic energy of various plasma species and the peel strength at various plasma species in ECR plasma treatments of nitrogen, oxygen, fluorine, sulfur, bromide and iodine, respectively.

FIG. 7 shows a relationship between the kinetic energy of nitrogen plasma species and the peel strength.

As shown in FIG. 6, the number of imino group or amino group was gradually increased and the number of imido group was considerably decreased with increasing kinetic energy. On the other hand, as shown in FIG. 7, the peel strength was increased when the kinetic energy was less than 10 eV, but was gradually decreased when it was not less than 10 eV. When the kinetic energy was 50 eV, the peel strength was only 120 g/cm and it was found that the aggregation breakage took place, with the result of peeling.

Figure 8:
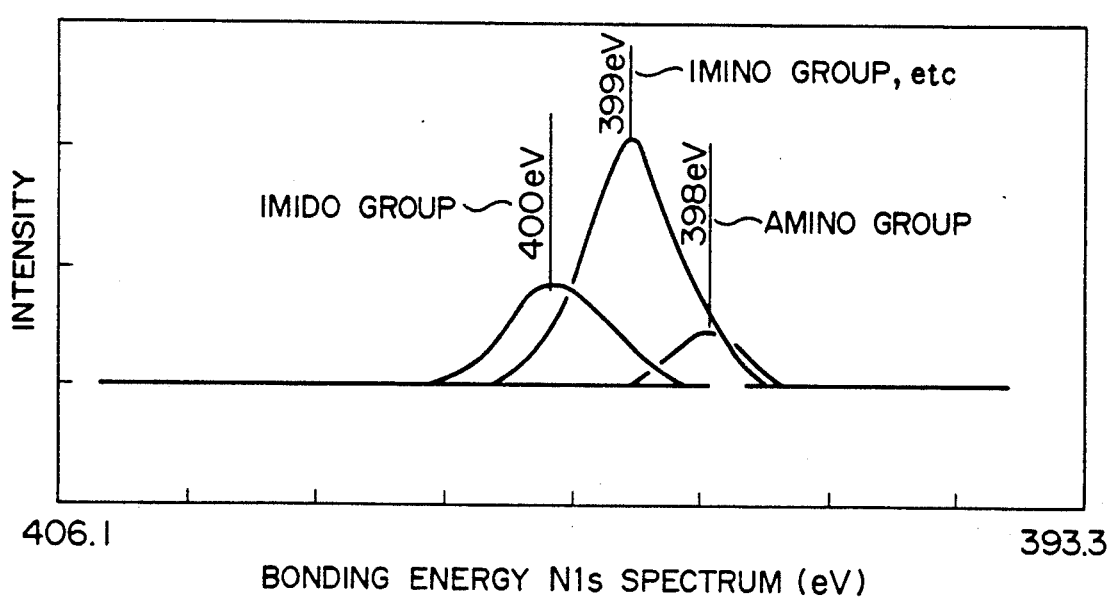

N $1_s$ spectrum of the surface region in that case is shown in FIG. 8. It was found by comparison with FIG. 4 that the number of imido group was decreased, as shown in FIG. 8. It seems that the peel strength was decreased due to the breakage of imido groups caused by an increase in the kinetic energy of nitrogen plasma species and the resulting deterioration of mechanical strength of the polyimide film.

Example 4

Surface treatment of polyimide film of low thermal expansion was carried out in the same manner as in Example 3, using an oxygen gas.

It was found by XPS analysis that ratios of oxygen atoms and nitrogen atoms to carbon atoms (O/C and N/C) in the surface region of the surface-treated film was 0.29 and 0.11, respectively.

Figure 9:
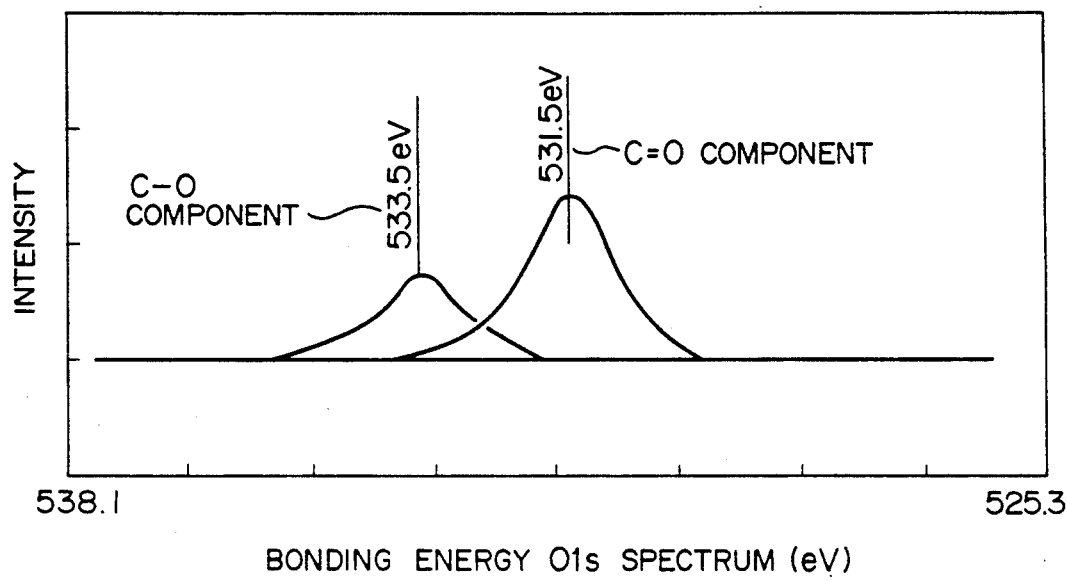
FIGS. 9 and 28 are diagrams showing O $1_s$ spectrum at XPS analysis of the modified surface of polyimide films of low thermal expansion according to the present invention.

FIG. 9 shows O $1_s$ spectrum of the surface region.

Figure 10:
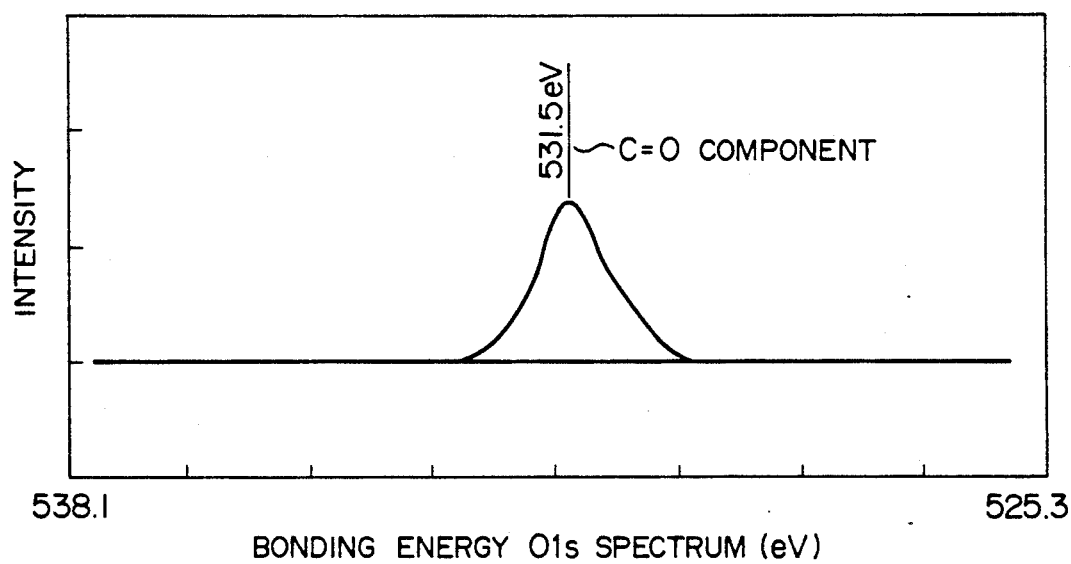
FIG. 10 is a diagram showing O $1_s$ spectrum at XPS analysis of the surface of polyimide film of low thermal expansion.

FIG. 10 shows O $1_s$ spectrum of the surface region without the surface treatment. As shown in FIG. 10, only a C=O component based on the imido groups was detected in the case of non-surface treatment, whereas in the case of plasma treatment a C=O component (including other groups besides the imido groups) (B.E.=531.5 eV) and a C—O component (B.E.=533.5 eV) were detected in their proportion of 65:35. Thus, it was found that the surface region of polyimide film of low thermal expansion, modified by oxygen plasma treatment, contained C=O and/or C—O components.

Figure 11:
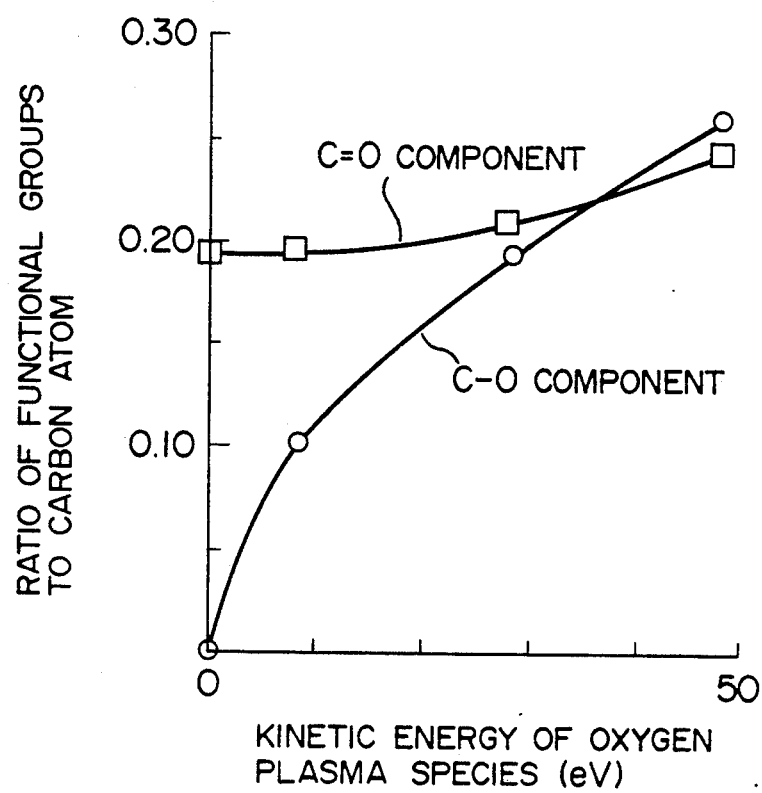
Figure 12:
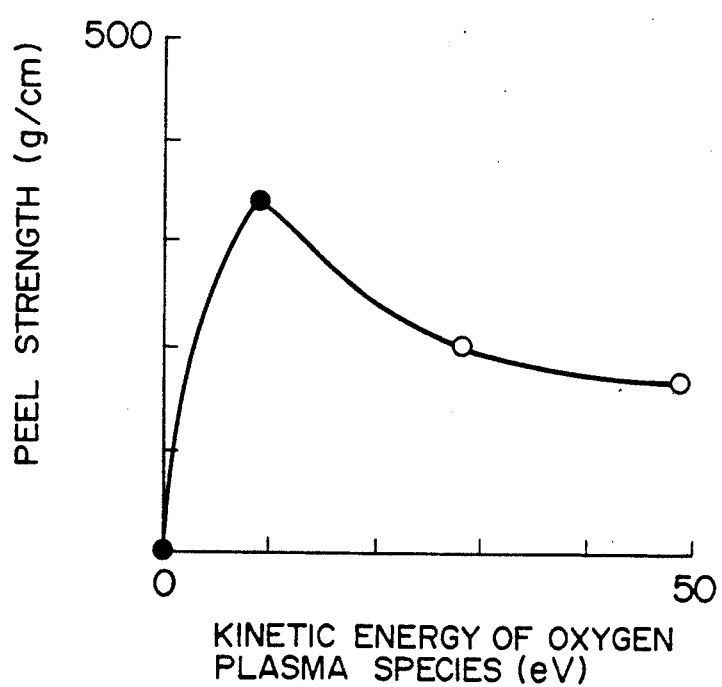

Relationships between the kinetic energy of oxygen plasma species and ratios of functional groups to carbon atoms when a bias was applied to the substrate are shown in FIG. 11, and a relationship between the kinetic energy of oxygen plasma species and the peel strength is shown in FIG. 12. It can be seen from FIG. 11 that there was not a substantial change in the C=O component but a considerable increase in the C—O component with an increase in the kinetic energy. This seems that the polyimide film was broken by oxygen. On the other hand, it can be seen from FIG. 12 that the peel strength was gradually decreased from about 10 eV as a peak with increasing kinetic energy of oxygen plasma species and was only 170 g/cm at about 50 eV, where it was found that the aggregation breakage took place with the result of peeling. It seems that the breakage of imido groups was connected to a decrease in the peel strength, as in Example 3.

Example 5

Surface treatment of polyimide film of low thermal expansion was carried out in the same manner as in Example 3, using a $CF_4$ gas.

It was found by XPS analysis that a ratio of fluorine atoms to carbon atoms (F/C) in the surface region of the treated film was 0.42.

Figure 13:
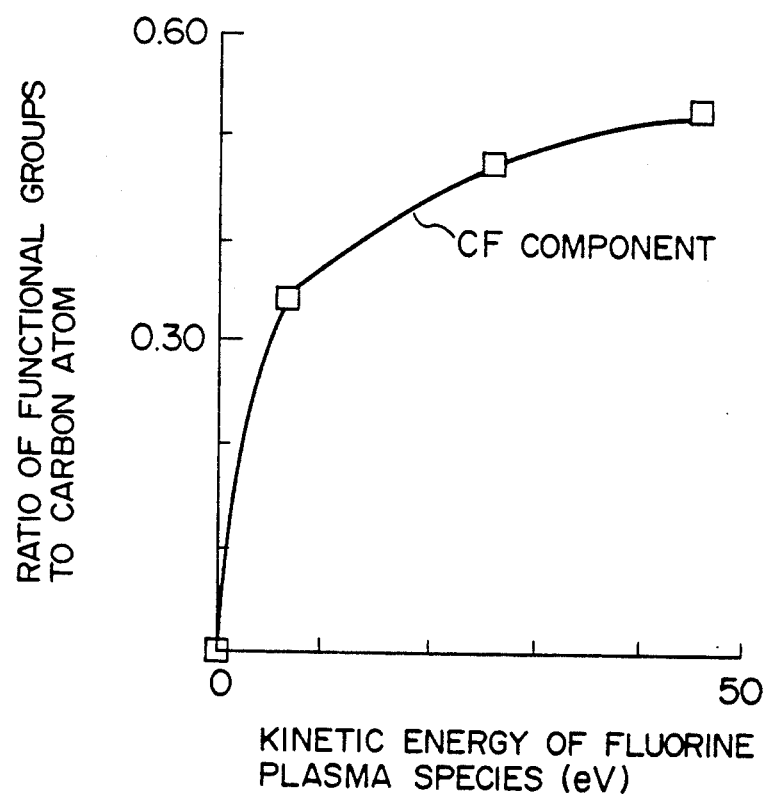
Figure 14:
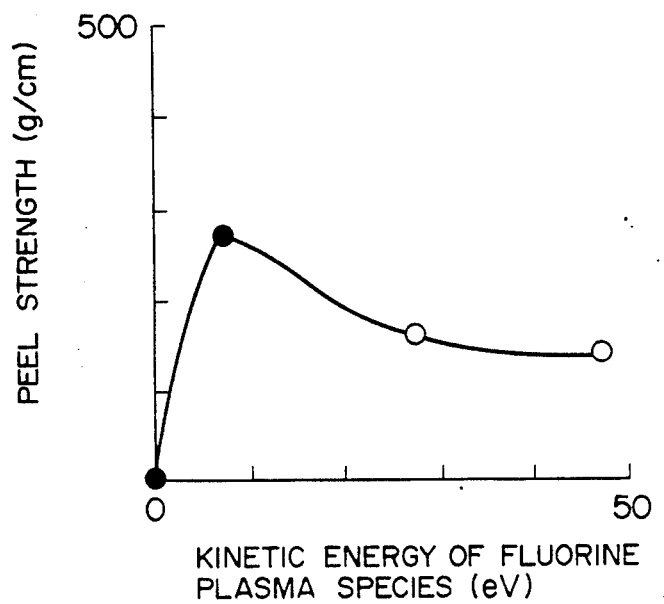

In the plasma treatment of polyimide surface containing no fluorine, a C—F component (B.E.=687.8 eV) was detected, and it can be seen therefrom that the surface region of polyimide of low thermal expansion, modified by $CF_4$ plasma treatment, contained C—F type fluorine. A relationship between the kinetic energy of plasma species and ratios of functional groups to carbon atoms when a bias was applied to the substrate, as in Example 3, is shown in FIG. 13. FIG. 14 shows a relationship between the kinetic energy of fluorine plasma species and the peel strength. It is obvious from FIG. 13 that the C—F component was increased with increasing kinetic energy. On the other hand, the peel strength was sharply increased with increasing kinetic energy of fluorine plasma species up to about 10 eV, but decreased over about 10 eV and the aggregation breakage took place over 30 eV with the result of peeling, as shown in FIG. 14. It is obvious therefrom that the breakage of imido groups is connected to a decrease in the peel strength, as in Example 3.

Example 6

Surface treatment of polyimide film of low thermal expansion was carried out in the same manner as in Example 3, using a carbon disulfide gas.

It was found by XPS analysis that a ratio of sulfur atoms to carbon atoms (S/C) in the surface region of the treated film was 0.20.

Figure 15:
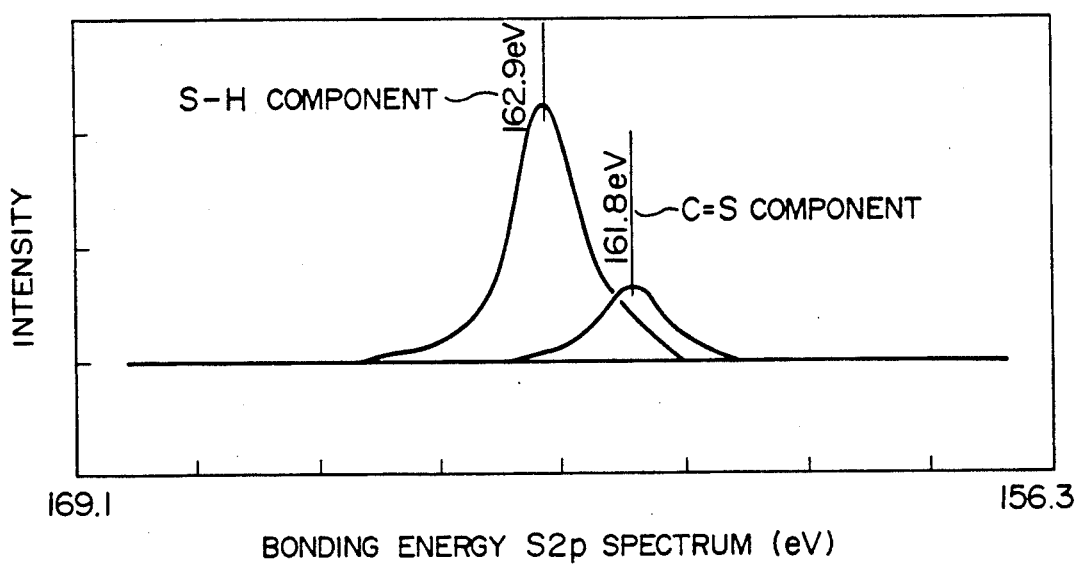
FIG. 15 is a diagram showing S $2_s$ spectrum at XPS analysis of the modified surface of polyimide film of low thermal expansion according to the present invention.

FIG. 15 shows S $2_p$ spectrum of the surface region. In the plasma treatment of the surface of polyimide containing no sulfur, a C=S component (B.E.=161.8 eV) and a S-H component (B.E.=162.9 eV) were detected, and their ratio was 36:64. It can be seen therefrom that the surface of polyimide film of low thermal expansion, modified by carbon disulfide plasma treatment, contained C=S and/or S—H type sulfur.

Figure 16:
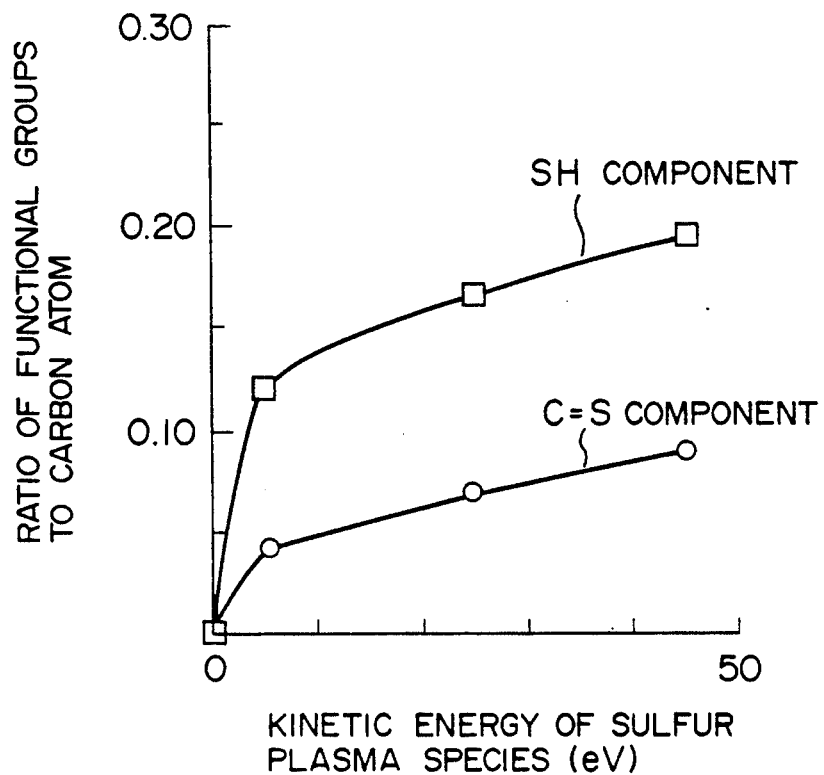
Figure 17:
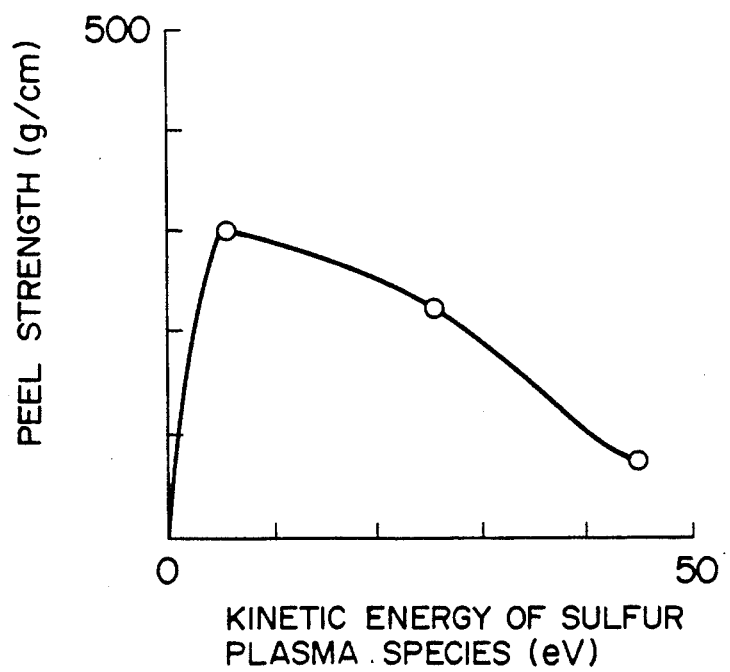

Relationships between the kinetic energy of sulfur plasma species and ratios of functional groups to carbon atoms when a bias was applied to the substrate are shown in FIG. 16. FIG. 17 shows a relationship between the kinetic energy of sulfur plasma species and the peel strength. It can be seen from FIG. 16 that the C=S component and S—H component were increased with increasing kinetic energy. As shown in FIG. 17, the peel strength was sharply increased with increasing kinetic energy of sulfur plasma species up to about 10 eV, but was decreased over about 10 eV, and the aggregation breakage took place over 30 eV with the result of peeling. It is obvious therefrom that the breakage of imido groups is connected to a decrease in the peel strength, as in Example 3.

Example 7

Surface treatment of polyimide film of low thermal expansion was carried out in the same manner as in Example 3, using a $CH_2Br_2$ gas.

It was found by XPS analysis that a ratio of bromine atoms to carbon atoms (Br/C) in the surface region of the treated film was 0.22.

In the plasma treatment of the surface of polyimide film containing no bromine, a C—Br component (B.E.=71.5 eV) was detected. It is obvious therefrom that the surface region of polyimide film of low thermal expansion, modified by $CH_2Br_2$ plasma treatment, contained C—Br type bromine atoms.

Figure 18:
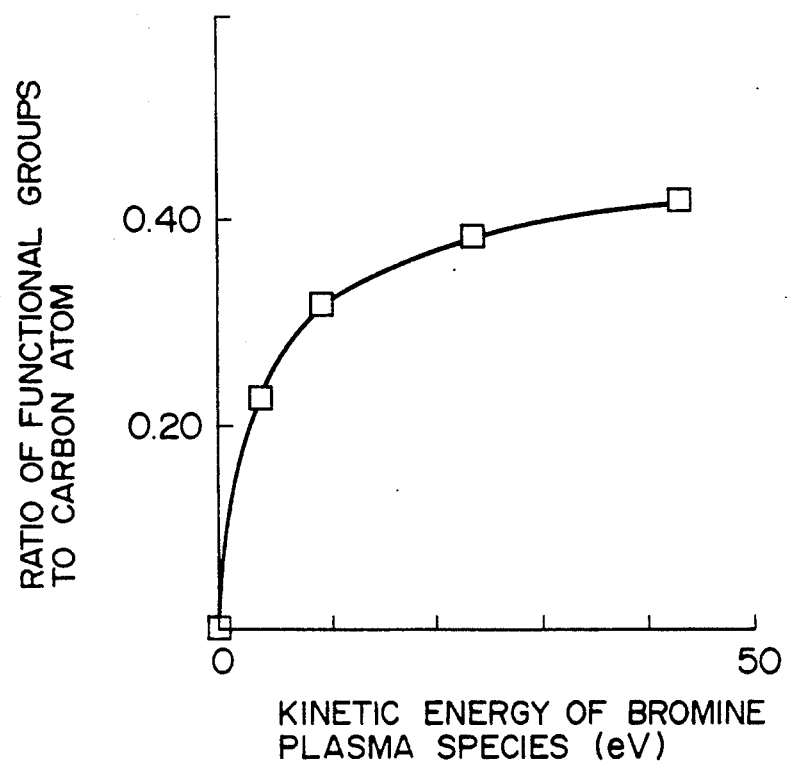
Figure 19:
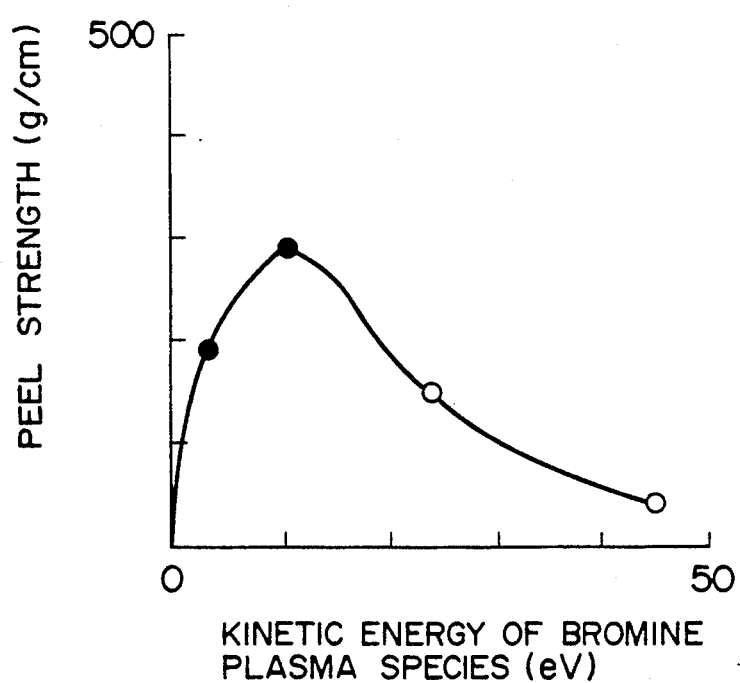

A relationship between the kinetic energy of bromine plasma species and a ratio of functional groups to carbon atoms when a bias was applied to the substrate is shown in FIG. 18. FIG. 19 shows a relationship between the kinetic energy of bromine plasma species and the peel strength. It is obvious from FIG. 18 that the C—Br component was increased with increasing kinetic energy. On the other hand, as shown in FIG. 19, the peel strength was sharply increased with increasing kinetic energy of bromine plasma species up to about 10 eV, but was decreased over about 10 eV and the aggregation breakage took place over 30 eV with the result of peeling. It is obvious therefrom that the breakage of imido group is connected to a decrease in the peel strength, as in Example 3.

Example 8

Surface treatment of polyimide film of low thermal expansion was carried out in the same manner as in Example 3, using a $CH_2I_2$ gas.

It was found by XPS analysis that a ratio of iodine atoms to carbon atoms (I/C) in the surface region of the treated film was 0.16.

In the plasma treatment of polyimide film surface containing no iodine, a C—I component (B.E.=621.2 eV) was detected. It is obvious therefrom that the surface region of polyimide film of low thermal expansion, modified by $CH_2I_2$ plasma treatment, contained C—I type iodine.

Figure 20:
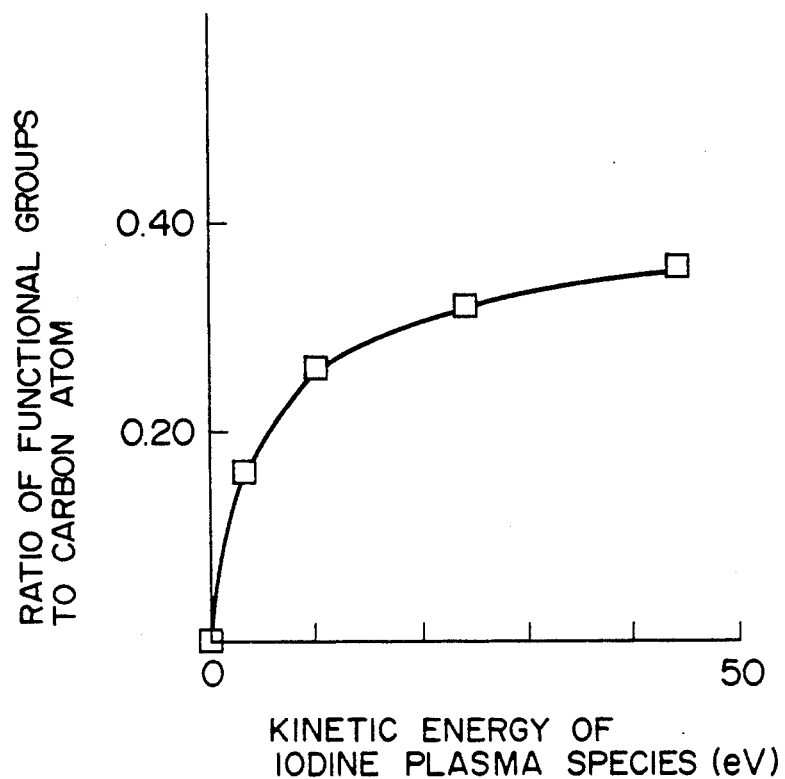
Figure 21:
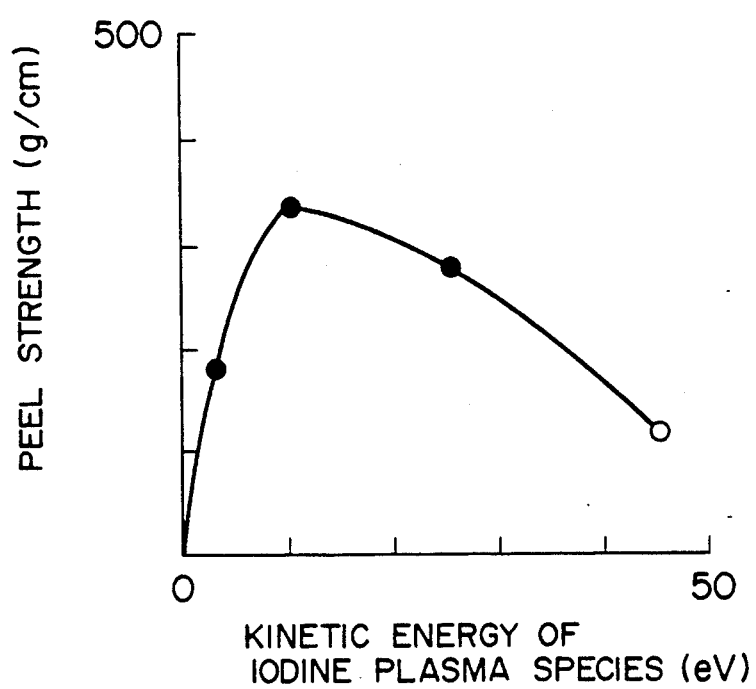

A relationship between the kinetic energy of plasma species and a ratio of functional groups to carbon atoms when a bias was applied to the substrate is shown in FIG. 20. FIG. 21 shows a relationship between the kinetic energy of iodine plasma species and the peel strength. It is obvious from FIG. 20 that the C—I component was increased with increasing kinetic energy.

On the other hand, as shown in FIG. 21, the peel strength was sharply increased with increasing kinetic energy of iodine plasma species up to about 10 eV, but was decreased over 10 eV, and the aggregation breakage took place over 30 eV with the result of peeling. It is obvious therefrom that the breakage of imido groups is connected to a decrease in the peel strength, as in Example 3.

Example 9

Figure 1:
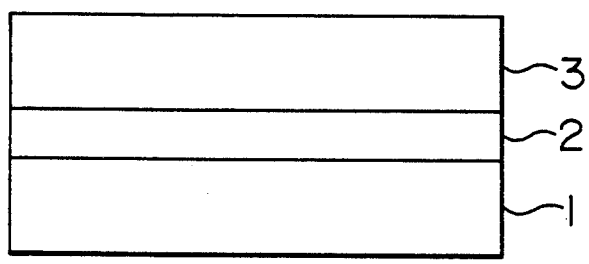
FIG. 1 is a partially enlarged view of a composite of organic macromolecular synthetic resin and a metal according to one embodiment of the present invention.
Figure 22:
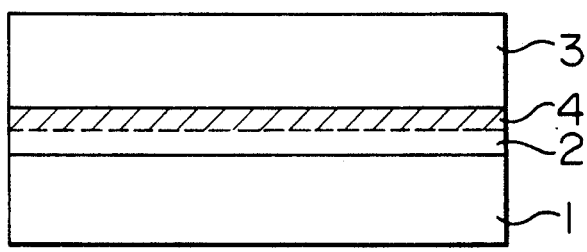
FIG. 22 is a partially enlarged view of a composite of organic macromolecular synthetic resin and a metal according to another embodiment of the present invention.

FIG. 22 shows a partially enlarged view of a composite of organic macromolecular synthetic resin and a metal according to another embodiment of the present invention, where numerals 1, 2 and 3 are identical with those in FIG. 1, and numeral 4 is a layer formed for enhancing the adhesiveness between the organic film as an insulating film and the metallic film as a conductor circuit. More specifically, the layer 4 was formed by injection of copper by ECR microwave plasma treatment.

A process for producing a composite of organic macromolecular synthetic resin and a metal shown in FIG. 22 will be explained below.

After formation of a polyimide film of low thermal expansion as an organic film in the same manner as in Example 1, surface treatment was further carried out also by the ECR microwave plasma CVD apparatus. That is, after the same nitrogen plasma treatment as in Example 3, a $H_2$ gas was passed at a flow rate of 3 cc/min. through a mass flow controller over solids of Cu (acac)$_2$ in a stainless steel tank heated at 100° C. On the other hand, an Ar gas was passed at a flow rate of 40 cc/min. from a plasma generation nozzle. By allowing a microwave of 130 W to hit the Ar gas nozzle under a pressure of 0.8 m Torr to generate a plasma, the Cu (acac)$_2$ gas introduced from a nozzle was decomposed by Ar and the resulting ionized copper was injected into the substrate under a given radio frequency. After the treatment for 10 minutes with a radio frequency output ranging from 0 to 500 W, copper was vapor deposited thereon in the same manner as in Example 3.

Figure 23:
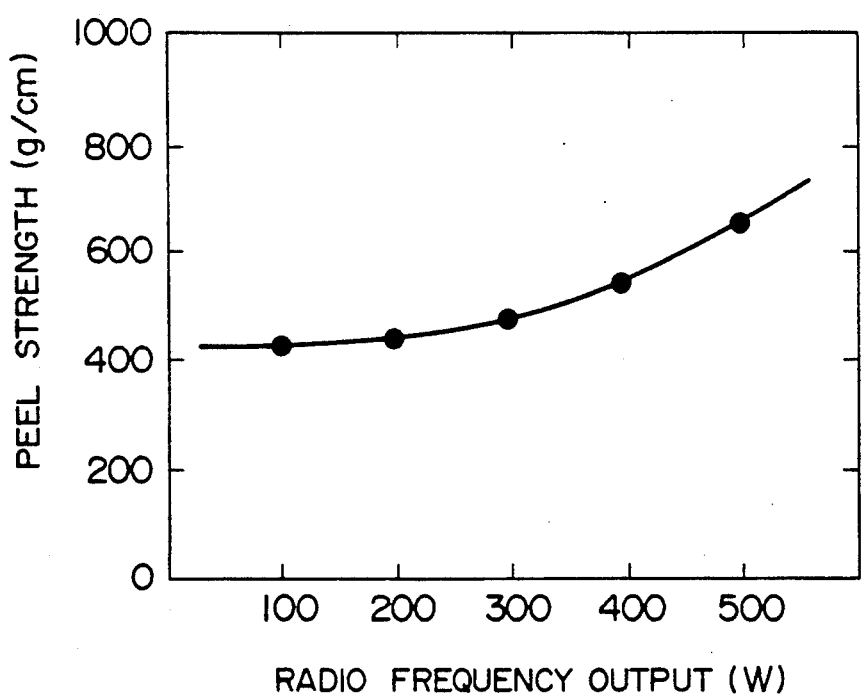
FIG. 23 is a diagram showing a dependency of the peel strength of a metallic film on the radio frequency output.

FIG. 23 shows a relationship between the radio frequency output and the peel strength. The copper ions were intensely injected with an increase in the substrate bias due to an increase in the radio frequency output and the peel strength was increased by the accelerated coordination bondage or anchoring effect. In this Example, Ar was used, but He could be used effectively, and acetylacetonato complexes, chlorides or fluorides of Ti, Cr, V, Ta, etc. may be decomposed in place of Cu (acac)$_2$. In this Example, the $N_2$ gas was discontinued to supply during the injection of Cu, but the $N_2$ gas may be continuously passed. In that case, a $Cu_xN_y$ type compound layer could be formed between the polyimide film of low thermal expansion and the metallic film.

Before the $N_2$ plasma treatment, the surface may be roughened by allowing an Ar plasma to hit the substrate. The surface may be roughened with a plasma of nitrogen, oxygen, etc. other than Ar.

It is obvious from the foregoing Examples and the relationships between the kinetic energy of various plasma species in the plasma treatments and the peel strength in the various plasma species, as shown in FIGS. 7, 12, 14, 17, 19 and 21 that a practical peel strength of 250 g/cm could be obtained with an energy of not more than 20 eV.

Example 10

After formation of a polyimide film of low thermal expansion in the same manner as in Example 1, surface treatment of the polyimide film was carried out by an ECR microwave plasma apparatus.

The surface treatment was carried out as follows: a substrate with the polyimide film of low thermal expansion was placed as a sample in a sample chamber, and an $NH_3$ gas was introduced into a plasma generation chamber to form an atmosphere under 0.1 m Torr. Then, a plasma was generated by irradiation of the $NH_3$ gas with a microwave of 50 to 100 W introduced through a microwave guide tube. A microwave output ranging from 50 to 1,000 W could be used. By changing a distance between an electron cyclotron resonance zone and the substrate, an influence of plasma on the substrate could be changed. In this Example, the distance was in a range of 0 to 30 cm.

By applying a radio frequency of 13.56 MHz to the substrate by a radio frequency oscillator in the plasma treatment, a negative bias could be applied to the substrate. As a result, a kinetic energy corresponding to the bias value could be given to the positive ions in the plasma.

Figure 24:
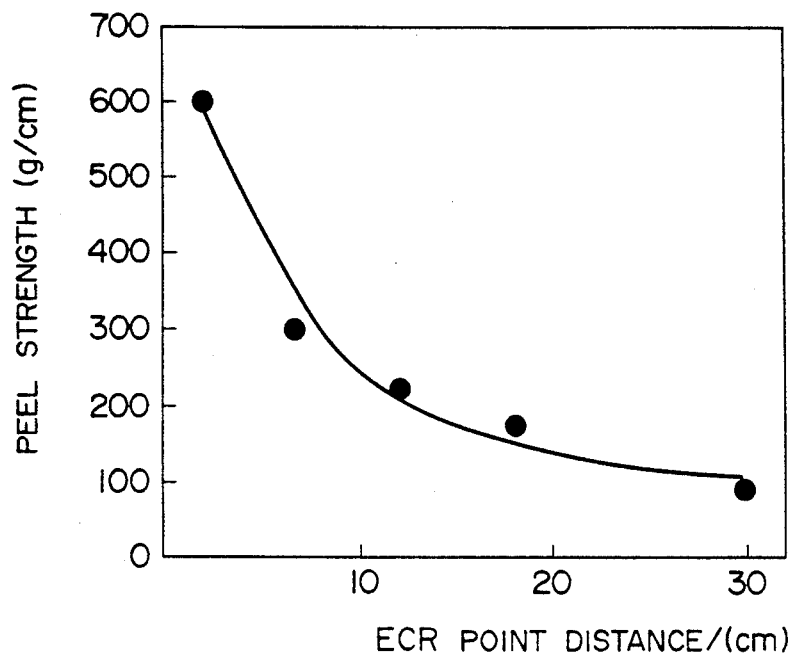
FIGS. 24 and 27 are diagrams showing relationships between the ECR point distance of various plasma species and the peel strength in ECR plasma treatments of ammonia and formic acid, respectively.

After the treatment in this manner for 3 minutes, the substrate was transferred into another vacuum chamber and copper was vapor deposited thereon to a film thickness of 5 μm at a substrate temperature of 200° C. and a vapor deposition rate of 100 Å/sec. by electron beam heating. Samples subjected to changing of the distance between the electron cyclotron resonance zone and the substrate were made into strips, 1 cm wide and subjected to 90° peel tests at a peeling speed of 0.5 min/min. The results are shown in FIG. 24. FIG. 24 is a diagram showing a relationship between an ECR point distance of plasma species in the ECR plasma treatment of ammonia and the peel strength.

The same peel test as above was made on the copper film on a polyimide film of low thermal expansion without the surface treatment (PIQ-L100) and it was found that the peel strength was less than 5 g/cm.

In the case of treatment only with a nitrogen gas, the peel strength was 450 g/cm, whereas in this Example the peel strength was 600 g/cm. In the case of a peel strength of 600 g/cm, it was found by XPS analysis that ratios of oxygen atoms and nitrogen atoms to carbon atoms (O/C and N/C) in the surface region were 0.21 and 0.19, respectively. In the molecular structure of polyimide of low thermal expansion (PIQ-L100), O/C and N/C were found by the analysis to be 0.18 and 0.09, respectively. Thus, it was found that the nitrogen concentration in the surface region was considerably increased.

Figure 25:
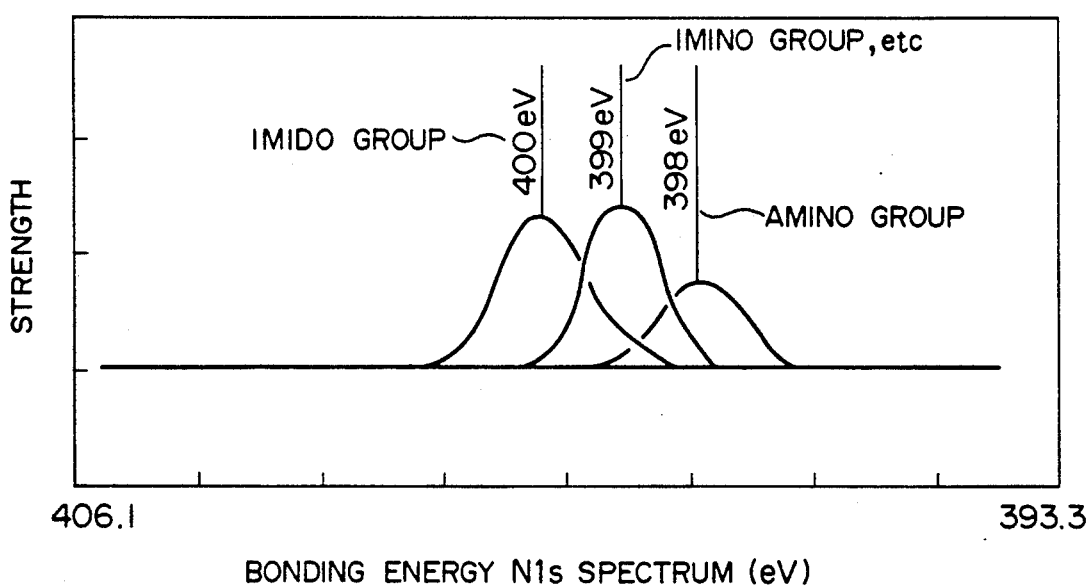

FIG. 25 shows N $1_s$ spectrum of the surface region of the polyimide film. Besides the imido group (B.E.=400 eV), an imino group (B.E.=399 eV) and an amino group (B.E.=398 eV) were detected, and their proportion was 39:41:20 in the order from higher to lower B.E.

Figure 26:
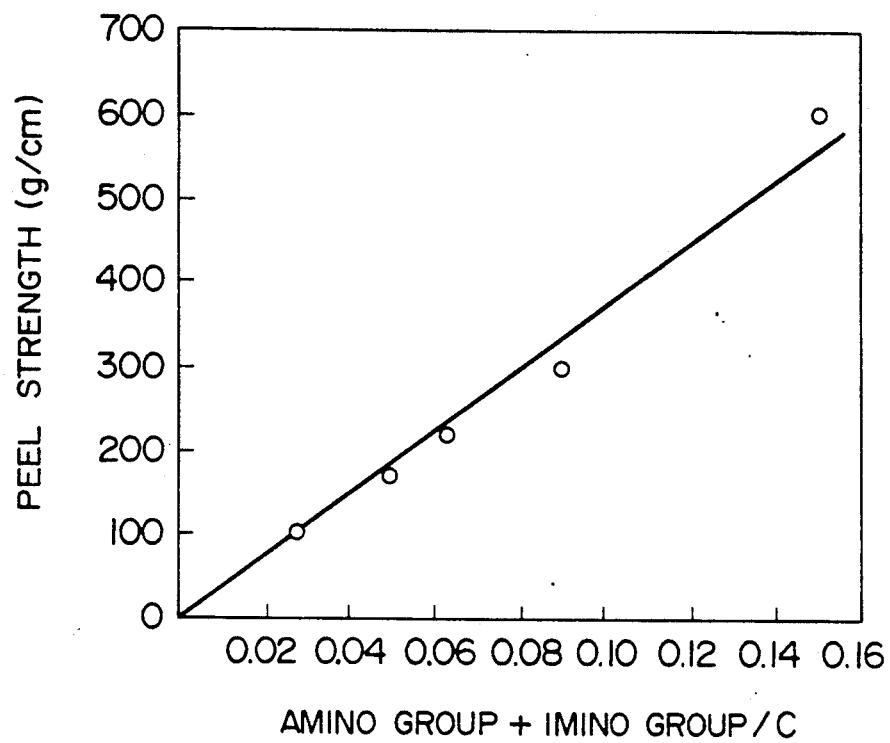
FIGS. 26 and 29 are diagrams showing relationships between amino group+imino group and carboxyl group and the peel strength in ECR plasma treatments of ammonia and formic acid, respectively.

FIG. 26 shows a relationship between the peel strength and (amino component + imino component). It is obvious therefrom that the adhesiveness and (amino component + imino component) are in a correlation therebetween.

Example 11

Surface treatment of polyimide film of low thermal expansion was carried out in the same manner as in Example 3, using a formic acid gas. Then, the substrate was transferred into another vacuum chamber and titanium was vapor deposited thereon to a film thickness of 500 Å at a substrate temperature of 200° C. and a vapor deposition rate of 5 Å/sec. by electron beam heating. Then, copper was vapor deposited further thereon to a film thickness of 5 μm at a substrate temperature of 200° C. and a vapor deposition rate of 10–100 Å/sec.

Figure 27:
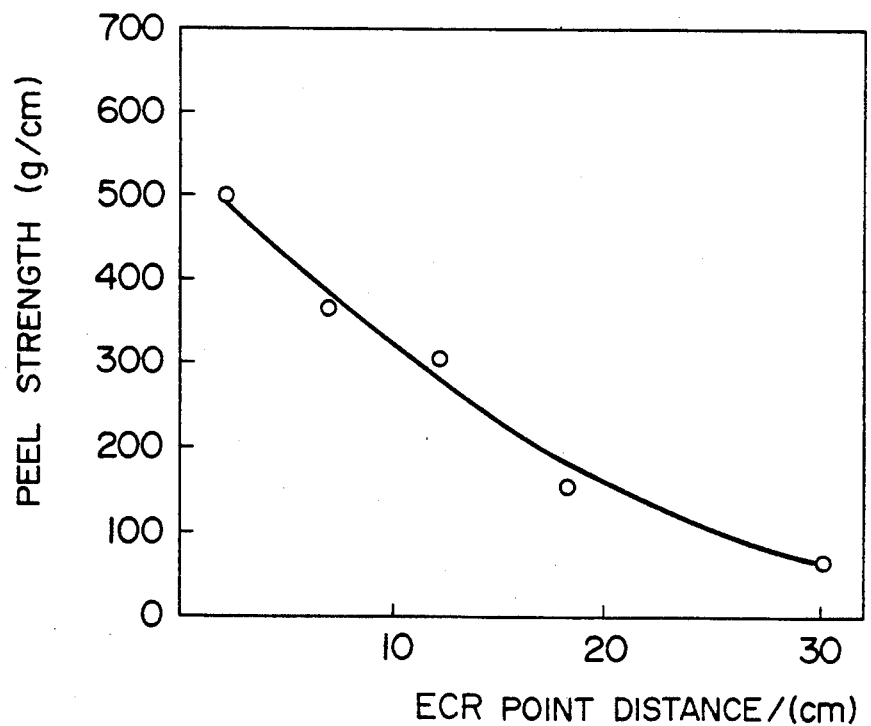

Then, peel tests were carried out in the same manner as in Example 1, and the results are shown in FIG. 27. FIG. 27 is a diagram showing a relationship between an ECR point distance of the plasma species in the ECR plasma treatment of formic acid and the peel strength. The same peel test was made of titanium-copper films having the same thicknesses as above on a polyimide film of low thermal expansion without the surface treatment (PIQ-L100), and it was found that the peel strength was less than 30 g/cm. In the case of treatment only with oxygen, the peel strength was 320 g/cm, whereas in this Example, the peel strength was 500 g/mc. In the case of a peel strength of 500 g/cm, it was found by XPS analysis that ratios of oxygen atoms and nitrogen atoms to carbon atoms in the surface region were 0.35 and 0.10, respectively, and that the oxygen concentration was considerably increased.

Figure 28:
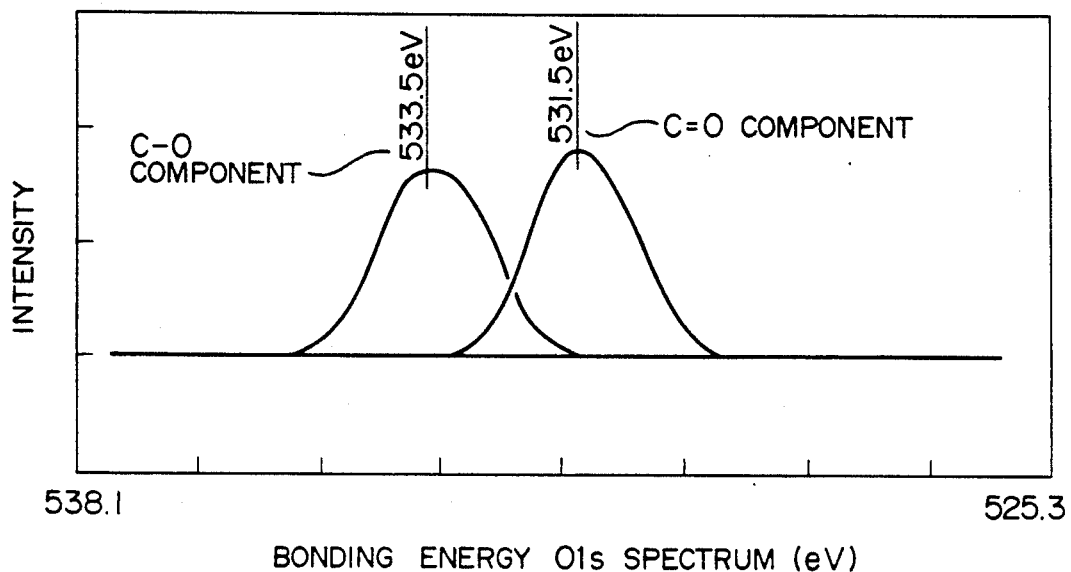

FIG. 28 shows O $1_s$ spectrum of the surface region of polyimide film, and a C—O component (B.E.=533 eV) and a C=O component (B.E.=532 eV) were detected and their proportion was 47:53 in the order from higher to lower B.E. It was further found by comparison with C $1_s$ spectrum that they were components of almost carboxyl groups.

Figure 29:
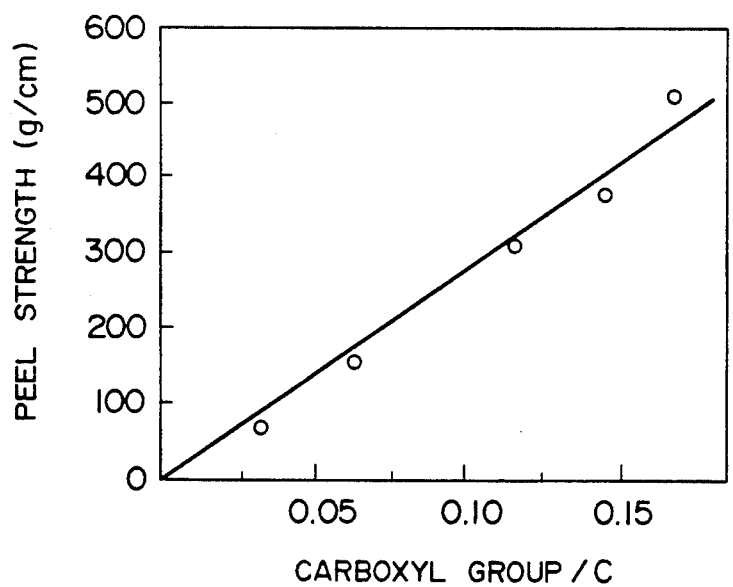

FIG. 29 shows a relationship between the peel strength and a ratio of carboxyl group to carbon atoms.

Example 12

Figure 30:
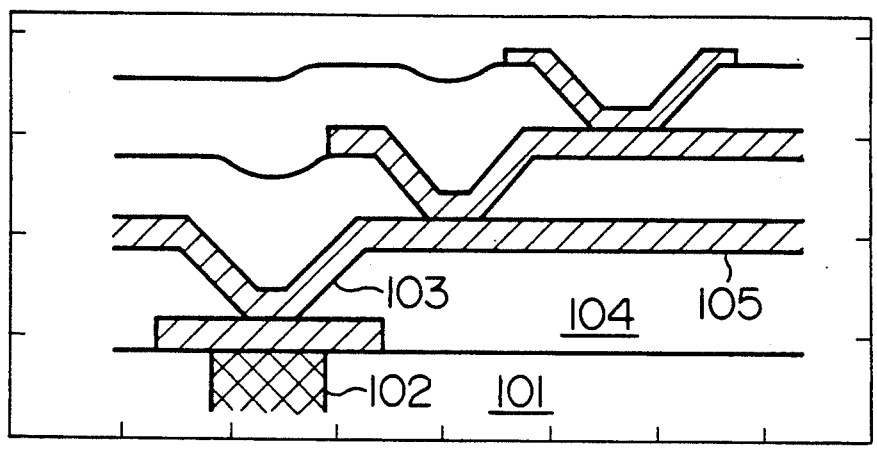
FIG. 30 is a cross-sectional structural view of a semiconductor package.

FIG. 30 is a cross-sectional structural view of a semiconductor package according to other embodiment of the present invention, where numeral 101 is a ceramic substrate, 102 a throughhole, 103 a polyimide film as an organic film and 104 a metallic film.

By treating the boundary surface of the polyimide film to copper, given by 105, according to the present invention, an adhesiveness is improved between the polyimide film and the metallic film, and a highly reliable circuit can be obtained thereby.

Figure 31:
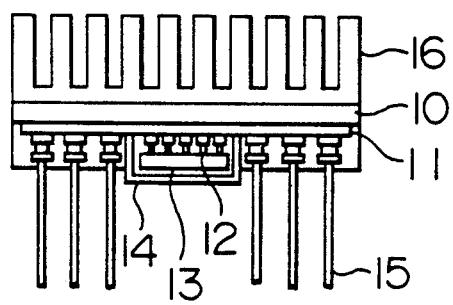
FIG. 31 is a structural view of a pin-grid array package.

FIG. 31 is a structural view of a pin-grid array package containing a semiconductor device, a kind of package substrate, according to further embodiment of the present invention, where a multi-layered circuit film 11 comprising metallic films and polyimide films as organic films is formed on a substrate 10, and a semiconductor device 13 is electrically connected to the multi-layered circuit film 11 through connecting terminals 12. Furthermore, pins 15 are formed on the multi-layered circuit films to input or output signals to or from the semiconductor 13 from or to the outside. Furthermore, the semiconductor device 13 is sealed with a cap 14 for insulation. Numeral 16 is heat radiation fins.

According to the present invention, the circuit reliability can be improved by an increase in the adhesiveness between the metallic films and the organic films, as compared with the conventional pin-grid array package.

In the present pin-grid array package, 400 or more pins, particularly 600 or more pins can be used. Furthermore, the amount of heat generation of the semiconductor device to be mounted on the pin-grid array package can be also increased owing to the increase in the adhesiveness between the metallic films and the polyimide films, and consumption power of the pin-grid array package can be also increased to 10 W or more.

Furthermore, 150,000 or more gates, particularly 450,000 or more gates can be obtained and the circuit width of the multi-layered circuit film in the pin-grid array peakage can be also made less than 40 μm.

In this Example, a semiconductor mounted pin-grid array package is shown, but a pin-grid array package even without a semiconductor device and in a cap-free state can have the same effect of the present invention.

In a resin-sealed semiconductor device, the present invention is applicable not only to the circuit films, but also to bonding surfaces between a lead frame and a resin used as a sealing material.

Figure 32:
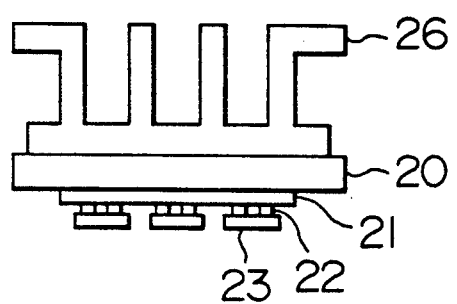
FIG. 32 is a partial structural view of a moduled semiconductor-mounted apparatus.

FIG. 32 is a partial structural view of a modulated, semiconductor-mounted apparatus, where a plurality of semiconductor devices are mounted. That is, a multi-layered, circuit film 21 comprising metallic films and polyimide films as organic films is formed on a substrate 20, and a plurality of semiconductor devices 23 are mounted thereon and are further electrically connected to the multi-layered circuit film 21 through connecting terminals 22. Numeral 26 is heat radiation fins.

In the semiconductor-mounted apparatus according to the present invention, finer wiring than the conventional wiring can be made owing to the improved adhesiveness between the metallic films and the polyimide films in the multi-layered circuit film, resulting in an increase in the mounting density. Thus, a semiconductor-mounted apparatus with a higher transmission speed can be provided.

Figure 33:
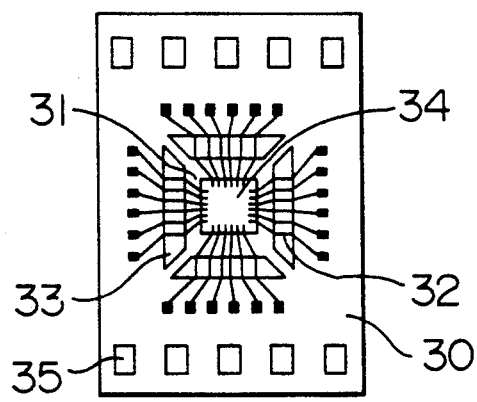
FIG. 33 is a structural view of TAB for mounting IC.

FIG. 33 is a structural view of TAB for mounting IC. A device hole 34, sprocket holes 35 and outer lead holes 33 are formed on a polyimide film 30 in a tape form (film form) as an organic film. Furthermore, metallic films as conductor wirings are laid as an inner lead 31 and an outer lead 32 on the polyimide film.

The present TAB has an improved wiring reliability owing to the improved adhesiveness between the polyimide film and the metallic films, making it possible to provide a wiring of higher density. Furthermore, a semiconductor device of generating a larger amount of heat can be mounted thereon. This example shows a TAB without a semiconductor device, but can hold also for a TAB in a semiconductor device-mounted state.

Furthermore, the present invention is particularly effective for applications in a sheet form, as TAB.

Figure 34:
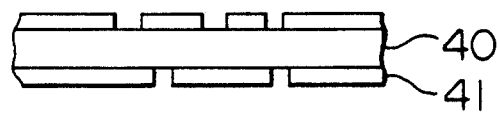
FIG. 34 is a structural view of a flexible circuit substrate.

FIG. 34 is a structural view of a flexible circuit substrate, where numeral 40 is a polyimide film as an organic film and 41 a metallic film as a conductor wiring. In the present flexible circuit substrate, wirings of higher density can be made owing to the improved adhesiveness between the polyimide film and the metallic film.

Figure 35:
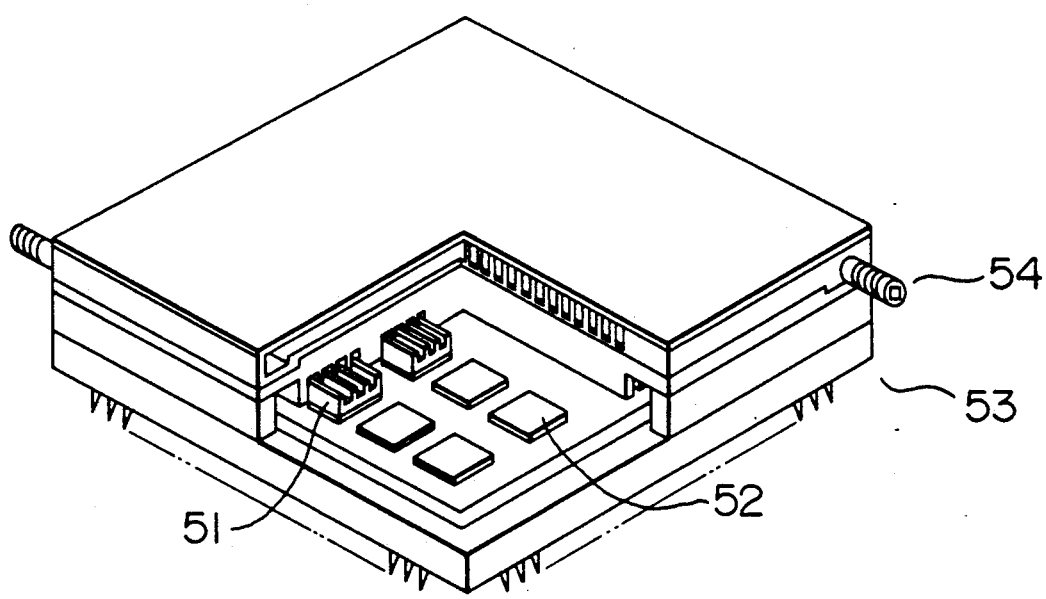
FIG. 35 is a structural view of a high density multi-chip module.

FIG. 35 is a structural view of a high density multichip module. A plurality of LSI chips 52 are mounted on a multi-layered substrate 53 and comb-formed contacts 51 are formed on the individual LSI chips 52. Furthermore, water feed connectors 54 for heat radiation are formed thereon to form a high density multichip module.

Figure 36:
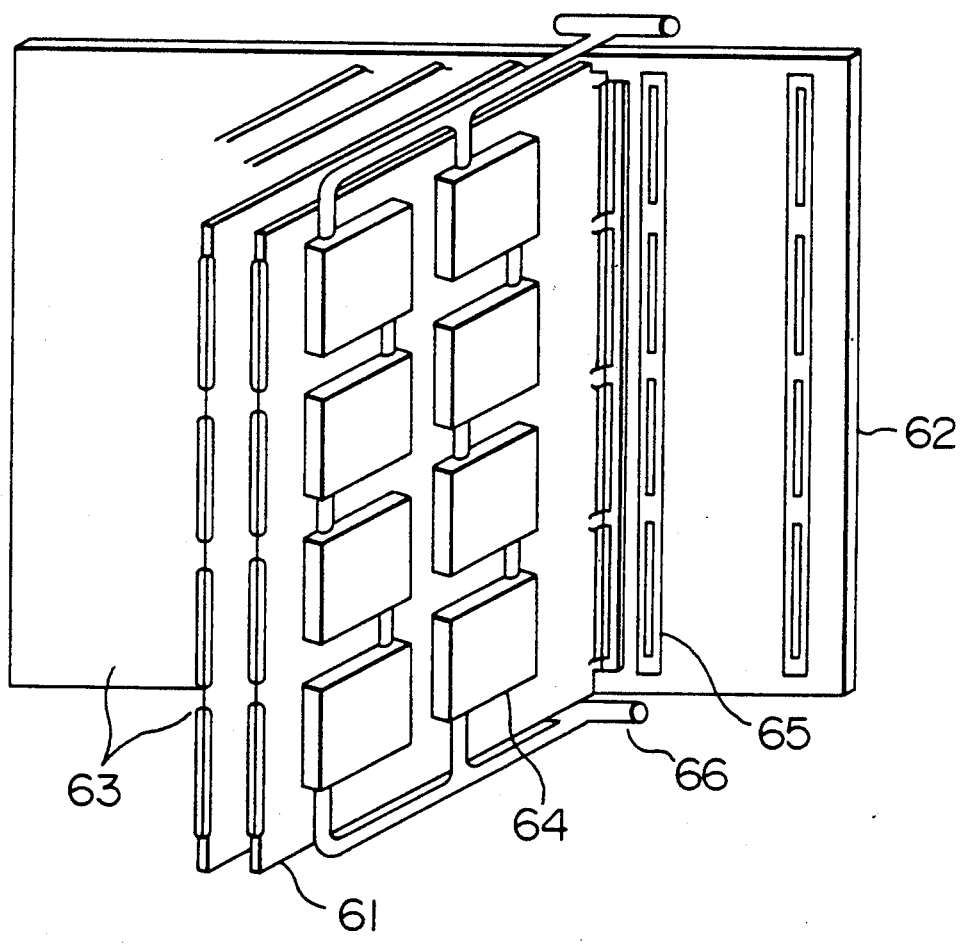
FIG. 36 is a structural view of a computer.

A computer mounted with a plurality of high density multi-chip module packages shown in FIG. 35 is shown in FIG. 36. A plurality of high density multi-chip module packages 64 are formed on a multi-layered, printed substrate 63 of low dielectric constant to form a package 61. The high density multi-chip module packages 64 are connected to one another with cooling water pipes 66 to radiate the heat from the individual module packages 64. Furthermore, a plurality of the packages 61 thus provided with the module packages 64 are formed into a platter 62 through multi-core connectors 65.

The multi-layered, printed substrate for use in the computer according to the present invention uses polyimide, particularly polyimide of low thermal expansion as insulating films and metals for conductor wirings, particularly copper as metallic films. Furthermore, functional groups are formed on the boundary surface of the polyimide films to the metallic films by exposing the surfaces of the polyimide films to at least one of chemical reactive gas phase molecules and gas phase ions having a kinetic energy of not more than 20 eV to improve the adhesiveness of the polyimide films to the metallic films, whereby finer wirings can be made and mounting of semiconductor devices at a higher density can be made. With a higher density mounting the signal transmission speed is also effectively increased.

Still furthermore, the adhesiveness can be improved when polyimide is used as insulating layers in a semiconductor device, and much finer wirings can be made.

Still furthermore, the present invention is applicable to electronic appliances requiring wirings of higher density such as IC cards, pocket TVs, cameras, liquid crystal drivers, etc.

Example 13

After formation of polyimide films of low thermal expansion in the same manner as in Example 1, the films were surface-treated by a corona discharge apparatus, a glow discharge apparatus and RF plasma apparatuses (barrel type and parallel plate typ). The surface treatment was carried out as follows.

At first, a substrate with the polyimide film of low thermal expansion was placed as a sample in a sample chamber and one of the following atmosphere was formed in a plasma generation chamber:

(1) in the case of corona discharge, the same atmosphere as the ambient atmosphere;
(2) in the case of glow discharge, an atmosphere of nitrogen gas under 1 m Torr; and
(3) in the case of RF plasma, an atmosphere of nitrogen gas under 50 m Torr.

The surface treatment was carried out with an output of 300 W.

In the case of corona discharge and glow discharge, the surface treatment was carried out by keeping the surface of the polyimide film in parallel to or vertical to the electrode.

Furthermore, the photo-emission intensity was measured when the wavelength was adjusted to 200-600 mm at the position near the surface.

Figure 37:
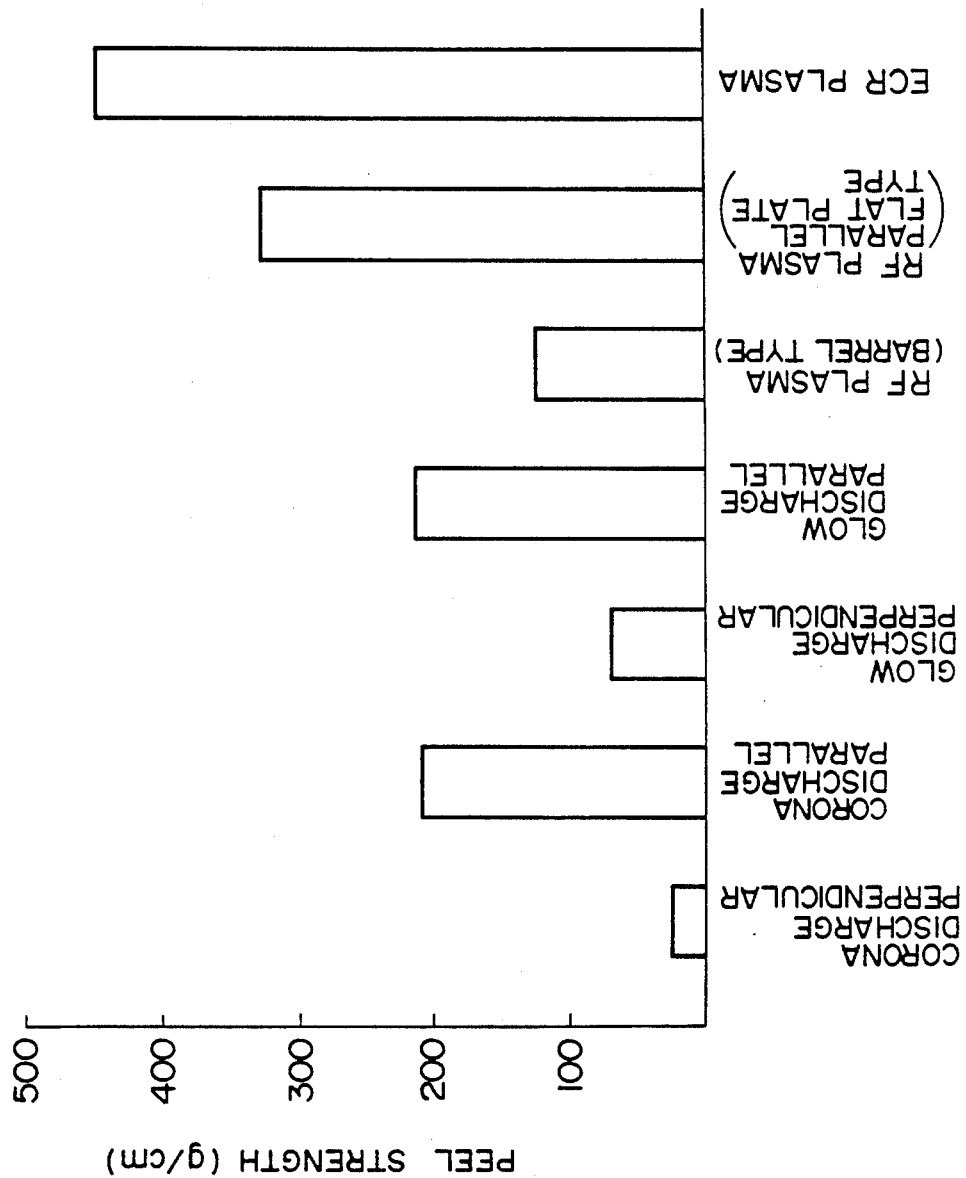
FIG. 37 is a diagram showing relationships between various treatments and the peel strength.

After the surface treatment for 3 minutes, copper was vapor deposited thereon in the same manner as in Example 1, and then the samples were subjected to peel tests in the same manner as in Example 1. The results are shown in FIG. 37. FIG. 37 is a diagram showing relationships between the respective treatments and the peel strength. As is obvious from FIG. 37, the treatment by ECR plasma can give a most distinguished adhesiveness. It was also found that the surface treatment by ECR plasma never brought about the aggregation breakage within the polyimide film.

Figure 38:
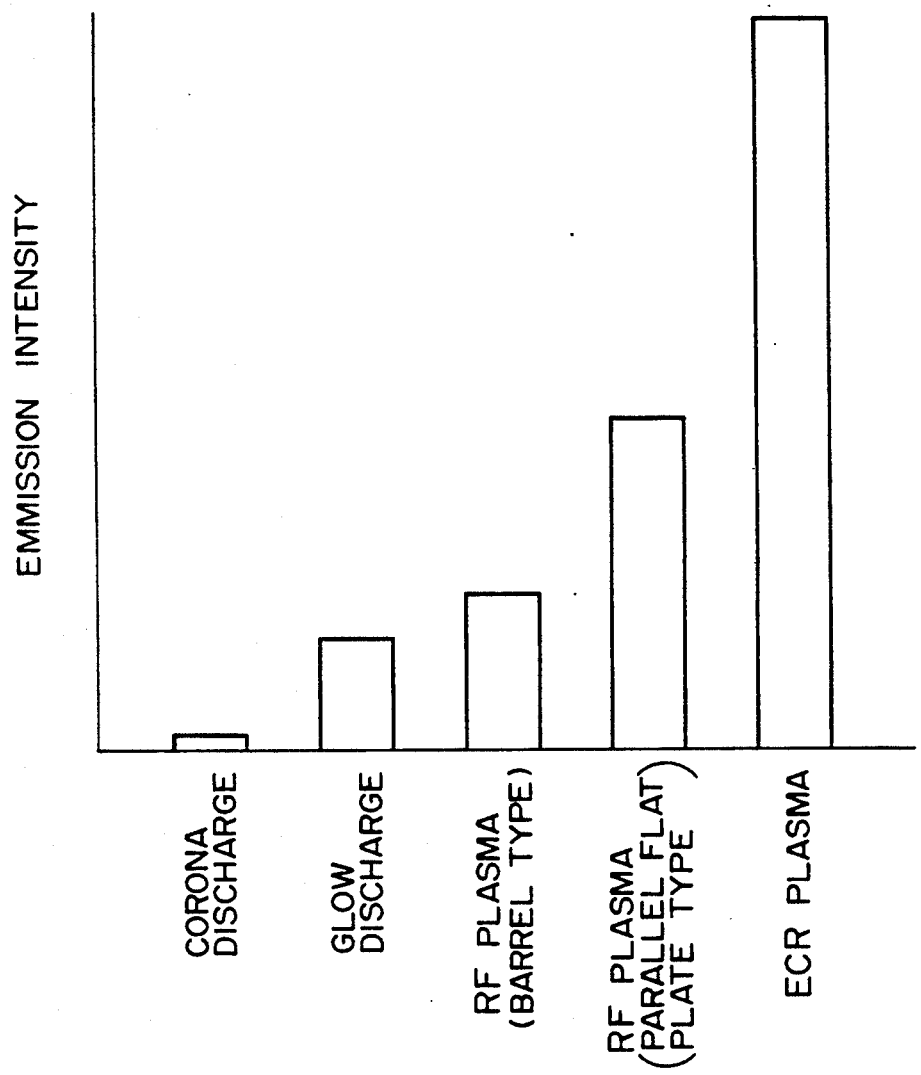
FIG. 38 is a diagram showing a photo-emission intensity (integrated values of 200 to 600 nm) on the substrate surface in various treatments.

FIG. 38 is a diagram showing relationships between the respective treatment and the light emission intensity at the position near the surface of polyimide film. It is obvious from FIGS. 37 and 38 that there is some correlation between the peel intensity and the photo-emission intensity. A higher photo-emission intensity means a high density of electrically excited species and a higher ionization efficiency, and thus ECR plasma is highest among others.

In the corona discharge and glow discharge, the peel strength is higher in the case of providing the polyimide film in parallel to the electrode than that in the case of providing the polyimide film perependicular to the electrode. However, in the polyimide film provided in parallel to the electrode, it was observed that the aggregation breakage took place, resulting in deterioration of polyimide film.

From the foregoing results it can be seen that the surface treatment by ECR plasma is most effective for improving the adhesiveness of the polyimide film to the metallic film.

According to the present invention, a composite of an organic film having a higher adhesiveness and a metallic film can be obtained.

Furthermore, a composite of an organic film without less deterioration in the film quality and a metallic film can be obtained because only the substantial surface of the organic film can be chemically modified.

Still furthermore, according to the present invention, a highly adhesive boundary surface of an organic film to a metallic film can be obtained and thus the durability, reliability, etc. of electronic appliances having such a boundary surface, that is, the present composite, can be considerably enhanced.

What is claimed is:

1. A composite, which comprises an organic macromolecular synthetic resin film having functional groups on its substantial surface, the functional groups being formed by exposing the substantial surface of organic macromolecular synthetic resin film to a plasma atmosphere of electronically excited state species formed by electron cyclotron resonance wherein the surface of the resin film is placed in parallel with the cyclotron movement of the plasma of the electronically excited state species at a place remote from the ECR point but within a distance of 30 cm from the ECR point in an electron cyclotron resonance plasma apparatus so that the surface of the resin film is chemically modified with the electronically excited state species, whereby functional groups which are reactable with a metallic material are formed in the surface of the resin film, and a metallic film formed on the organic macromolecular synthetic resin film having the functional groups.

2. A composite, which comprises an organic macromolecular synthetic resin film having functional groups on the surface and substantially free from aggregation breakages, the functional groups being formed by exposing the surface of organic macromolecular synthetic resin film to a plasma atmosphere of electronically excited state species generated at a place remote from the ECR point but within a distance of 30 cm from the ECR point, the surface of the resin film being placed in parallel with the cyclotron movement of the plasma of the electronically excited state species, until the functional groups which are reacted with metal are formed on the surface of the resin film, the functional groups comprising amino groups, imino groups, amido groups, imido groups and cyano groups in an electron cyclotron resonance plasma apparatus, and a metallic film formed on the organic macromolecular synthetic resin film, a relative concentration per one carbon atom of the functional groups as total of amino groups, imino groups, amido groups, imido groups and cyano groups being 0.05 to 0.25.

3. A composite, which comprises an organic macromolecular synthetic resin film having functional groups on the surface and substantially free from aggregation breakages, the functional groups being formed by exposing the surface of organic macromolecular synthetic resin film to a plasma atmosphere of electronically excited state species generated at a place remote from the ECR point but within a distance of 30 cm from the ECR point, the surface of the resin film being placed in parallel with the cyclotron movement of the plasma of the electronically excited state species generated at a place remote from the ECR point but within a distance of 30 cm from the ECR point, until the functional groups which are reacted with metal are formed on the surface of the resin film, in an electron cyclotron resonance plasma apparatus, the functional groups comprising carbonyl and carboxyl groups, and a metallic film formed on the organic macromolecular synthetic resin film, a relative concentration per one carbon atom of the functional groups as total of carbonyl groups and carboxyl groups being 0.09 to 0.39.

4. A composite, which comprises an organic macromolecular synthetic resin film having functional groups on the surface and substantially free from aggregation breakages, the functional groups being formed by exposing the surface of organic macromolecular synthetic resin film to a plasma atmosphere of electronically excited state species generated at a place remote from the ECR point but within a distance of 30 cm from the ECR point, the surface of the resin film being placed in parallel with the cyclotron movement of the plasma of the electronically excited state species generated at a place remote from the ECR point but within a distance of 30 cm from the ECR point, until the functional groups which are reacted with metal are formed on the surface of the resin film in an electron cyclotron resonance plasma apparatus, the functional groups comprising hydroxyl groups, and a metallic film formed on the organic macromolecular synthetic resin film, a relative concentration per one carbon atom of the functional groups as hydroxyl groups being 0.17 to 0.48.

5. A composite, which comprises an organic macromolecular synthetic resin film having functional groups on the surface and substantially free from aggregation breakages, the functional groups being formed by exposing the surface of organic macromolecular synthetic resin film to a plasma atmosphere of electronically excited state species generated at a place remote from the ECR point but within a distance of 30 cm from the ECR point, the surface of the resin film being placed in parallel with the cyclotron movement of the plasma of the electronically excited state species, generated at a place remote from the ECR point but within a distance of 30 cm from the ECR point, until the functional groups which are reacted with metal are formed on the surface of the resin film in an electron cyclotron resonance plasma apparatus, the functional groups comprising oxime groups and a metallic film formed on the organic macromolecular synthetic resin film, a relative concentration per one carbon atom of the functional groups as oxime groups being 0.07 to 0.24.

6. A composite, which comprises an organic macromolecular synthetic resin film having functional groups on the surface and substantially free from aggregation breakages, the functional groups being formed by exposing the surface of organic macromolecular synthetic resin film to a plasma atmosphere of electronically excited state species generated at a place remote from the ECR point but within a distance of 30 cm from the ECR point, the surface of the resin film being placed in parallel with the cyclotron movement of the plasma of the electronically excited state species generated at a place remote from the ECR point but within a distance of 30 cm from the ECR point, until the functional groups which are reacted with metal are formed on the surface of the resin film in an electron cyclotron resonance plasma apparatus the functional groups comprising C=S groups, and S—H groups, and a metallic film formed on the organic macromolecular synthetic resin film, a relative concentration per one carbon atom of the functional groups as S—H groups being 0.10 to 0.17 and that as C=S groups being 0.03 to 0.07.

7. A composite, which comprises an organic macromolecular synthetic resin film having functional groups on the surface and substantially free from aggregation breakages, the functional groups being formed by exposing the surface of organic macromolecular synthetic resin film to a plasma atmosphere of electronically excited state species generated at a place remote from the ECR point but within a distance of 30 cm from the ECR point, the surface of the resin film being placed in parallel with the cyclotron movement of the plasma of the electronically excited state species generated at a place remote from the ECR point but within a distance of 30 cm from the ECR point, until the functional groups which are reacted with metal are formed on the surface of the resin film in an electron cyclotron resonance plasma apparatus, the functional groups comprising iodine-containing groups, and a metallic film formed on the organic macromolecular synthetic resin film, a relative concentration per one carbon atom of the functional groups as iodine-containing groups being 0.15 to 0.32.

8. A composite, which comprises an organic macromolecular synthetic resin film having functional groups on the surface and substantially free from aggregation breakages, the functional groups being formed by exposing the surface of organic macromolecular synthetic resin film to a plasma atmosphere of electronically excited state species generated at a place remote from the ECR point but within a distance of 30 cm from the ECR point, the surface of the resin film being placed in parallel with the cyclotron movement of the plasma of the electronically excited state species, generated at a place remote from the ECR point but within a distance of 30 cm from the ECR point, until the functional groups which are reacted with metal are formed on the surface of the resin film in an electron cyclotron resonance plasma apparatus, the functional groups comprising borine-containing groups, and a metallic film formed on the organic macromolecular synthetic resin film, a relative concentration per one carbon atom of the functional groups as borine-containing groups being 0.28 to 0.37.

9. A composite, which comprises an organic macromolecular synthetic resin film having functional groups on the surface and substantially free from aggregation breakages, the functional groups being formed by exposing the surface of organic macromolecular synthetic resin film to a plasma atmosphere of electronically excited state species generated at a place remote from the ECR point but within a distance of 30 cm from the ECR point, the surface of the resin film being placed in parallel with the cyclotron movement of the plasma of the electronically excited state species generated at a place remote from the ECR point but within a distance of 30 cm from the ECR point, until the functional groups which are reacted with metal are formed on the surface of the resin film in an electron cyclotron resonance plasma apparatus, the functional groups comprising fluorine-containing groups, and a metallic film formed on the organic macromolecular synthetic resin film, a relative concentration per one carbon atom of the functional groups as fluorine-containing groups being 0.30 to 0.42.

10. A process for producing a composite, which comprises a step of exposing the substantial surface of an organic macromolecular synthetic resin film to a plasma atmosphere of electronically excited state species generated at a place remote from the ECR point but within a distance of 30 cm from the ECR point, the surface of the resin film being placed in parallel with the cyclotron movement of the plasma of the electronically excited state species, until functional groups which are reactable with the metal are formed on the surface of the resin film in an electron cyclotron resonance plasma apparatus and a step of forming a metallic film on the surface of the organic macromolecular synthetic resin film having the functional groups.

11. A process for producing a composite, which comprises a step of forming a modified layer having a thickness of not more than 100 Å on the surface of an organic macromolecular resin film by exposing the surface to a plasma atmosphere of electronically excited state species generated at a place remote from the ECR point but within a distance of 30 cm from the ECR point, in an electron cyclotron resonance plasma apparatus wherein the surface of the resin film is placed in parallel with the cyclotron movement of the plasma of the electronically excited state species at a place remote from the ECR point but within a distance of 30 cm from the ECR point until the surface of the resin is chemically modified to form functional groups which are reactable with metal, and a step of forming a metallic film on the modified layer containing said functional groups.

12. A process for producing a metal-rein composite, which comprises the steps of:

exposing the surface of an organic macromolecular resin to a plasma atmosphere of electronically excited state species formed by electronic cyclotron resonance in a reduced atmospheric pressure at a place remote from the ECR point, but within a distance of 30 cm from the ECR point, the surface of the resin to be modified being placed in parallel with the cyclotron movement of the electronically excited state species in the plasma atmosphere until the surface of the resin is chemically modified to form functional groups which are reactable with the metal; and forming a metal on the resin with a modified surface containing the functional groups.

13. A process for producing a metal-rein composite, which comprises the steps of:

exposing the surface of an organic macromolecular synthetic resin to a plasma atmosphere wherein electronically excited state species formed in a reduced atmospheric pressure at a place remote from a plasma generation zone in a plasma generating apparatus are biased to move in a direction and the surface of the resin is placed in parallel with the movement of the electronically excited state species in the plasma atmosphere whereby the surface of the resin is chemically modified to form functional groups which are reactable with the metal; and forming a metal on the resin with a modified surface.

* * * * *